(12) United States Patent
Li

(10) Patent No.: US 12,729,109 B2
(45) Date of Patent: Sep. 8, 2026

(54) MICROMECHANICAL ARM ARRAY FOR MEMS ACTUATORS

(71) Applicant: Taiwan Semiconductor Manufacturing Company, Ltd., Hsinchu (TW)

(72) Inventor: Yu-Hsun Li, Yunlin (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 196 days.

(21) Appl. No.: 18/639,457

(22) Filed: Apr. 18, 2024

(65) Prior Publication Data

US 2025/0326630 A1 Oct. 23, 2025

(51) Int. Cl.
*B81B 7/00* (2006.01)
*B81C 1/00* (2006.01)
(Continued)

(52) U.S. Cl.
CPC ........ *B81B 7/0016* (2013.01); *B81C 1/00825* (2013.01); *H02N 1/008* (2013.01);
(Continued)

(58) Field of Classification Search
CPC ............ B81B 7/0016; B81B 2201/033; B81B 2203/0136; B81B 2203/0163;
(Continued)

(56) References Cited

U.S. PATENT DOCUMENTS 10,637,438 B2 * 4/2020 Garcia .................. H03H 9/568
2001/0040419 A1 * 11/2001 Behin .................. G02B 6/359 310/309

(Continued)

FOREIGN PATENT DOCUMENTS

CN 115480389 A 12/2022
TW 1595672 B 8/2017
TW 202238897 A 10/2022

OTHER PUBLICATIONS

Submission Receipt of U.S. Appl. No. 18/362,937, filed Jul. 31, 2023.

(Continued)

*Primary Examiner* — Ahmed Elnakib
(74) *Attorney, Agent, or Firm* — Lippes Mathias LLP

(57) ABSTRACT

A micro-electromechanical system (MEMS) structure is useful as an actuator for moving an image sensor for optical image stabilization. The MEMS actuator includes one or more micromechanical arm arrays. Each arm array includes a first array of spaced-apart fingers formed from a piezoelectric material, and a second array of spaced-apart fingers formed from an electrically conductive material. The distal ends of the first array of fingers and the distal ends of the second array of fingers are interposed between each other. Micro-springs connect the interposed distal ends of each set of adjacent fingers together. A metal cap is present above the distal ends of the first array of fingers and the distal ends of the second array of fingers. Micro-springs connect the metal cap to the distal end of each finger of the first array of fingers. This structure has increased stability and strength.

20 Claims, 37 Drawing Sheets

(51) Int. Cl.
*H02N 1/00* (2006.01)
*H04N 23/54* (2023.01)
*H04N 23/68* (2023.01)

(52) U.S. Cl.
CPC . *B81B 2201/033* (2013.01); *B81B 2203/0136* (2013.01); *B81B 2203/0163* (2013.01); *B81B 2203/0307* (2013.01); *B81B 2203/04* (2013.01); *B81C 2201/0116* (2013.01); *B81C 2201/014* (2013.01); *B81C 2201/016* (2013.01); *H04N 23/54* (2023.01); *H04N 23/687* (2023.01)

(58) Field of Classification Search
CPC ........ B81B 2203/0307; B81B 2203/04; B81B 2201/038; B81C 1/00825; B81C 2201/0116; B81C 2201/014; B81C 2201/016; B81C 1/00182; H02N 1/008; H04N 23/54; H04N 23/687
USPC ......................................... 310/300, 309, 310
See application file for complete search history.

(56) References Cited

U.S. PATENT DOCUMENTS

2016/0268927 A1* 9/2016 Liu ........................ H02N 1/008
2017/0133951 A1* 5/2017 Liu .......................... G02B 7/09
2025/0047218 A1* 2/2025 Li .......................... B81B 7/0016
2025/0326630 A1* 10/2025 Li .......................... B81B 7/0016
2025/0330103 A1* 10/2025 Li .......................... B81B 3/0037
2025/0361140 A1* 11/2025 Li ........................ B81C 1/00825

OTHER PUBLICATIONS

Taiwan Office Action for Application No. 11420783290 Dated Jul. 31, 2025.

* cited by examiner 110
120
143
139
139
137
135
135
230
220
230

Y
Z
110
120
143
139
139
137
135
135
232
220
232

Y
Z 142
140
138
136
134
132
272
110
200
190
220
240

Y
Z
272
260
200
240
262
212

Y
X

440

442

MICROMECHANICAL ARM ARRAY FOR MEMS ACTUATORS

BACKGROUND

Micro-electromechanical systems (MEMS) is a technology that employs miniature mechanical and electro-mechanical elements (e.g., devices or structures) on a wafer substrate. Devices or structures that can be used in MEMS include sensors, actuators, and other structures. MEMS devices may be used in a wide range of applications, including, for example and without limitation, optical/imaging devices, and the like.

MEMS structures can be made using photolithographic patterning processes that use ultraviolet light to transfer a desired mask pattern to a photoresist on a semiconductor wafer. Etching processes may then be used to transfer to the pattern to a layer below the photoresist. This process is repeated multiple times with different patterns to build different layers on the wafer substrate and make a useful device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
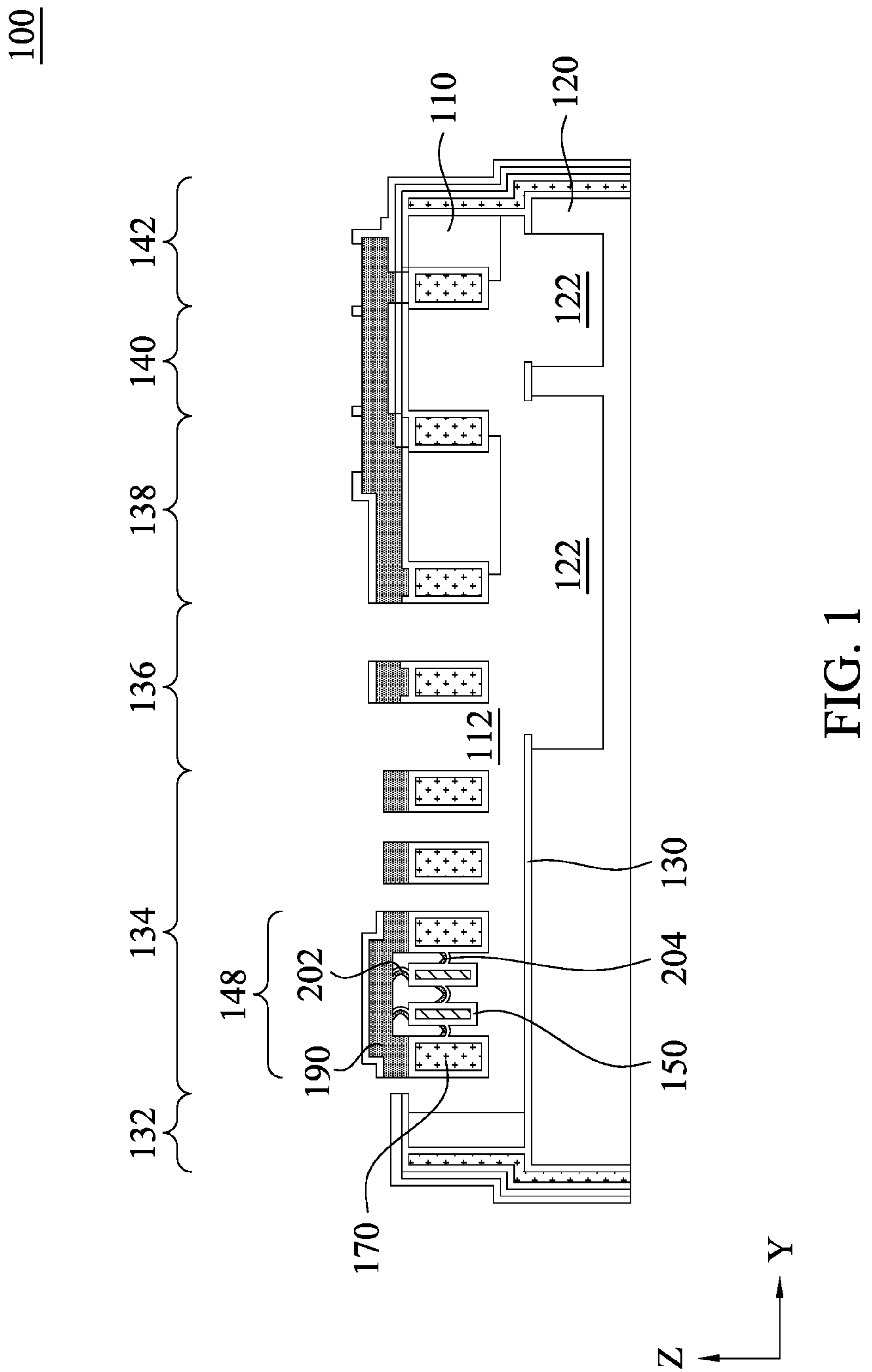
FIG. 1 is a side cross-sectional view of a micromechanical arm array, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The term "about" can be used to include any numerical value that can vary without changing the basic function of that value. When used with a range, "about" also discloses the range defined by the absolute values of the two endpoints, e.g. "about 2 to about 4" also discloses the range "from 2 to 4." The term "about" may refer to plus or minus 10% of the indicated number.

The present disclosure relates to structures which are made up of different layers. When the terms "on" or "upon" are used with reference to two different layers (including the substrate), they indicate merely that one layer is on or upon the other layer. These terms do not require the two layers to directly contact each other, and permit other layers to be between the two layers. For example all layers of the structure can be considered to be "on" the substrate, even though they do not all directly contact the substrate. The term "directly" may be used to indicate two layers directly contact each other without any layers in between them. In addition, when referring to performing process steps to the substrate or upon the substrate, this should be construed as performing such steps to whatever layers may be present on the substrate as well, depending on the context.

The present disclosure relates to micromechanical arm arrays that are especially suited for use in a micro-electro-mechanical system (MEMS) actuator. The MEMS actuator can convert electrical signals into mechanical signals, and is usually electrically connected to other integrated circuits (ICs) to form a system. Such actuators are commonly used in optical image capture devices, such as cameras which can be present as standalone handheld cameras or as part of devices like cellphones. However, the micromechanical arm arrays can be broken, for example due to impacts/shocks like drops from a large height.

In the present disclosure, new micromechanical arm arrays are disclosed that have improved stability and strength. The micromechanical arm array includes two arrays of fingers, each array of fingers extending from an arm. In some embodiments, one array is made of a piezoelectric material. The other array is made of an electrically conductive material which is not piezoelectric, such as polysilicon. Micro-springs are present between adjacent fingers, and are also present between a metal cap and the array of piezoelectric fingers. In other embodiments, the ratio of the number of fingers in the first array to the number of fingers in the second array is an integer greater than 1. The spring lifetime is improved.

FIG. 1 is a side cross-sectional view of a first example embodiment of a package 100 that includes a MEMS micromechanical arm array 148, in accordance with some embodiments of the present disclosure.

The package 100 includes a top wafer 110 (also known as a device wafer) and a bottom wafer 120 (also known as a handle wafer), which are bonded together through a bonding layer 130. This package is also known as a silicon-on-insulator (SOI) substrate.

Continuing, the micromechanical arm array 148 is present in the top wafer 110. The top wafer 110 has multiple sections in the horizontal direction, which are labeled here as an anchor arm section 132, a driving comb section 134, a hinge section 136, an inner frame section 138, a spring section 140, and an outer frame section 142. The micromechanical arm array 148 is located in the driving comb section 134. These various sections together make up a quadrant of a MEMS actuator (as will be discussed later herein).

The anchor arm section 132 provides structural integrity and aids in supporting the driving comb section. The hinge section 136 allows for pivotal movement, or allows for the controlled rotation of other components relative to the driving comb section. The inner frame section 138 provides structural support and stability. The spring section 140 provides some elasticity to maintain the desired positioning and movement of the components, and also provides a restoring force to bring the components back to their original position after actuation. The outer frame section 142 generally provides structural integrity, protecting the internal components from external and environmental forces.

A cavity 112 is present within the top wafer 110. The micromechanical arm array 148 is disposed within the cavity and can move freely within the cavity. The cavity also extends continuously below the hinge section 136, the inner frame section 138, and the spring section 140. Two smaller cavities 122 are also present within the bottom wafer 120, which are generally located below the hinge section 136, the inner frame section 138, and the spring section 140. The cavity 112 in the top wafer 110 is connected to the two smaller cavities 122 in the bottom wafer 120.

The micromechanical arm array contains two separate arrays of fingers, a first array of piezoelectric fingers 150 and a second array of electrically conductive fingers 170. The piezoelectric fingers are spaced apart from each other. Similarly, the electrically conductive fingers are spaced apart from each other. As illustrated here, a set of two piezoelectric fingers 150 is interposed between a set of two electrically conductive fingers 170.

A metal cap 190 is present above the first array of piezoelectric fingers 150 and the second array of electrically conductive fingers 170. The first array of piezoelectric fingers 150 are joined to the metal cap 190 by "vertical" micro-springs 202. In addition, "horizontal" micro-springs 204 are present between adjacent fingers 150, 170.

Figure 2:
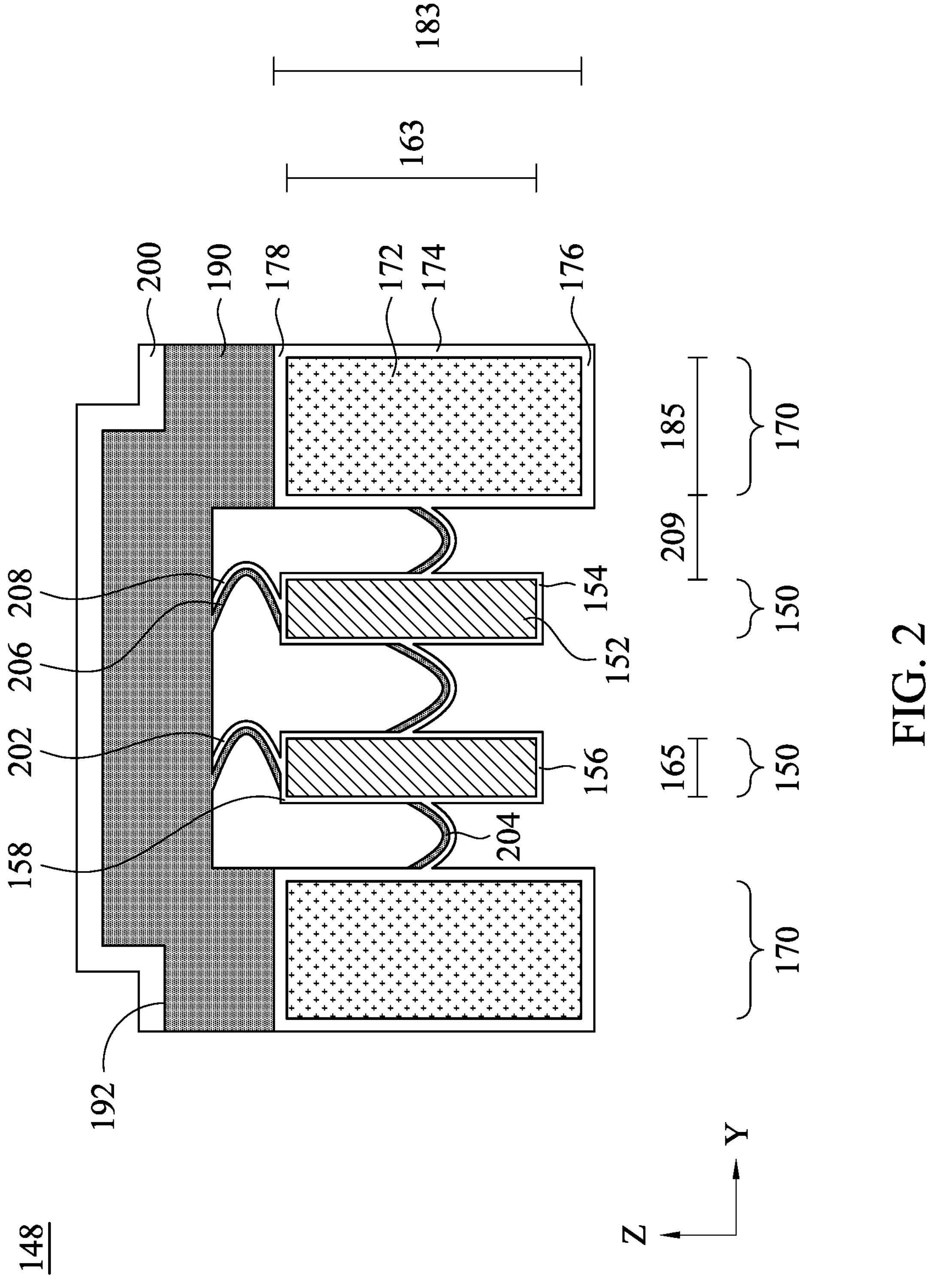
FIG. 2 is a magnified side cross-sectional view of the micromechanical arm array, in accordance with some embodiments of the present disclosure.

FIG. 2 is a magnified side cross-sectional view of the micromechanical arm array 148. It is noted that this is an extremely simplified illustration for purposes of description only, and is not fully representative of the complete micromechanical arm array 148.

As illustrated here, each piezoelectric finger 150 includes a core 152, which is formed from a piezoelectric material. A cover layer 154 is present around all sides of the core 152, and isolates the core from the cavity. The cover layer may act as an etch stop layer, and is generally made from a dielectric material. Each piezoelectric finger also has a free end 156 (or bottom end) and a fixed end 158 (or top end). In this view, the piezoelectric finger has a height 163 and a width 165.

Similarly, each electrically conductive finger 170 includes a core 172, which is formed from an electrically conductive material that is not piezoelectric. A cover layer 174 is present around all sides of the core 172, and isolates the core from the cavity. The cover layer may act as an etch stop layer, and is generally made from a dielectric material. Each electrically conductive finger also has a free end 176 (or bottom end) and a fixed end 178 (or top end). The electrically conductive finger has a height 183 and a width 185. In particular embodiments, the electrically conductive fingers 170 are made of polysilicon, and the cover layer is formed from silicon dioxide ($SiO_2$).

As illustrated here, the height 183 of the electrically conductive finger is greater than the height 163 of the piezoelectric finger. In some particular embodiments, the heights 183, 163 may independently range from about 150 micrometers (μm) to about 200 μm. Other ranges are also within the scope of the present disclosure. Similarly, the width 185 of the electrically conductive finger is greater than the width 165 of the piezoelectric finger. However, these dimensions are not required for operation of the micromechanical arm array, and can be reversed. In addition, the two fingers 150, 170 are illustrated as being located so their top surfaces are at the same height or level. Again, this is not required for operation of the micromechanical arm array.

A passivation layer 200 is present upon the top surface 192 of the metal cap. As illustrated here, the metal cap 190 directly contacts the fixed ends 178 of the second array of electrically conductive fingers 170, and does not directly contact the fixed ends 158 of the first array of piezoelectric fingers 150. Instead, the fixed ends of the first array of piezoelectric fingers 150 are joined to the metal cap 190 by the "vertical" micro-springs 202. The opposite arrangement is also contemplated, with the metal cap 190 directly contacting the first array of piezoelectric fingers 150, and the second array of electrically conductive fingers 170 being joined to the metal cap 190 by the "vertical" micro-springs 202. The "horizontal" micro-springs 204 are present between adjacent fingers 150, 170. The free ends 156, 176 of both arrays of fingers are able to move freely below the metal cap.

Each micro-spring is made from a combination of two layers, a metal layer 206 and a dielectric layer 208. In particular embodiments, the metal layer 206 is a metal or metal alloy, such as and without limitation aluminum (Al) or an aluminum alloy, such as AlCu; copper (Cu); tungsten (W); or nickel (Ni). In particular embodiments, the dielectric layer is made of silicon dioxide ($SiO_2$), although other materials can also be used. Generally speaking, the two layers have different or opposite tensile properties, and so can provide vibration isolation, resonance control, and damping and energy dissipation. This reduces the energy that is transmitted to the fingers due to external shocks. In some embodiments, the micro-springs 202, 204 may have a length 209 of about 1.6 micrometers (μm) or more, although other ranges are also within the scope of the present disclosure. This is approximately the distance between adjacent fingers. In some embodiments, the distance between two adjacent piezoelectric fingers is different from the distance between a piezoelectric finger 150 and an adjacent electrically conductive finger 170.

Figure 3A:
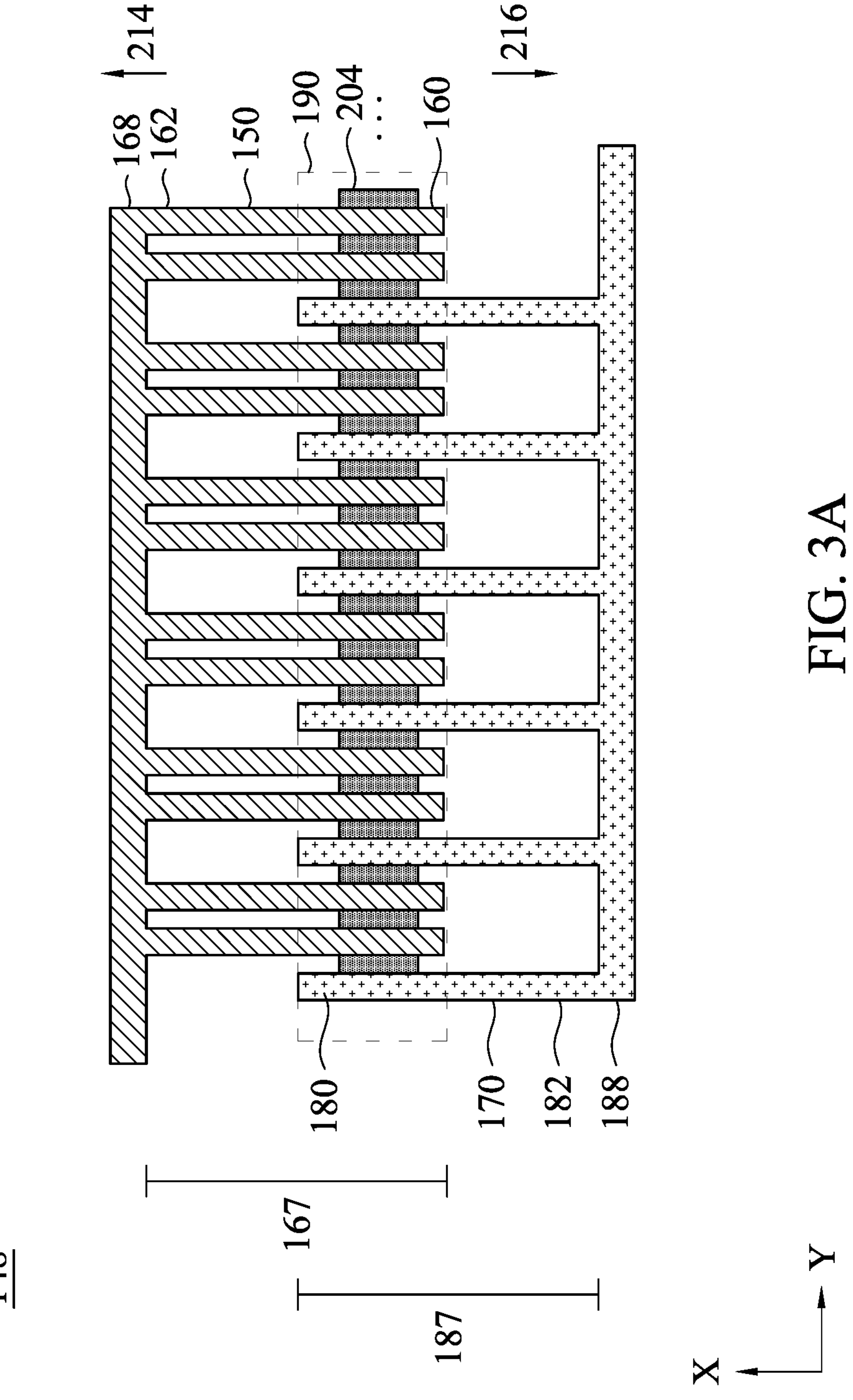
FIG. 3A is a plan view of a first embodiment of a micromechanical arm array having a first array of piezoelectric fingers interposed with a second array of electrically conductive fingers at their distal ends, and micro-springs connecting adjacent fingers. The ratio of piezoelectric fingers to electrically conductive fingers is 2:1.

FIG. 3A is a plan view of the micromechanical arm array of FIG. 2. Again, this is an extremely simplified illustration for purposes of description only, and is not fully representative of the complete micromechanical arm array 148.

As better seen here, the proximal ends 162 of the piezoelectric fingers extend from the distal ends 160 in a first direction 214 and are joined to a first arm 168. Put another way, the piezoelectric fingers 150 extend from the first arm. The first arm is also made from the piezoelectric material, and is also covered by a cover layer (not shown here). The proximal ends 182 of the electrically conductive fingers extend from the distal ends 180 in a second direction 216 opposite the first direction and are joined to a second arm 188. Put another way, the electrically conductive fingers 170 extend from the second arm. The second arm is also made from the electrically conductive material and is also covered by a cover layer (not shown here). The fingers 150, 170, extend in a first horizontal direction (i.e. X-axis). The two arms 168, 188 extend in a second horizontal direction (i.e. Y-axis). Although not illustrated here, the other ends of the two arms are connected to the anchor arm section 132 and the outer frame section 142.

The piezoelectric fingers 150 may be described as extending from the first arm 168 towards the electrically conductive fingers 170, and vice versa. The distal ends 160, 180 of the fingers 150, 170 are interposed or interlaced between each other. Put another way, the distal ends of the first array of fingers overlap with the distal ends of the second array of fingers. In some embodiments, the fingers 150, 170 may have a length 167, 187 of about 1 millimeter (mm) to about 3 mm, although other values and ranges are within the scope of this disclosure.

The "horizontal" micro-springs 204 connect the distal ends of adjacent fingers to each other. The metal cap 190 covers the distal ends, and is shown here in dotted line. It is noted that the micromechanical arm array may have a high number of piezoelectric fingers 150 and electrically conductive fingers 170, and is not limited by these illustrative drawings, as indicated by the continuing dots. In this illustration, the ratio of piezoelectric fingers 150 to electrically conductive fingers 170 is 2:1, i.e. the integer 2. The piezoelectric fingers are spaced such that a set of two piezoelectric fingers are present between each set of two electrically conductive fingers.

Figure 3B:
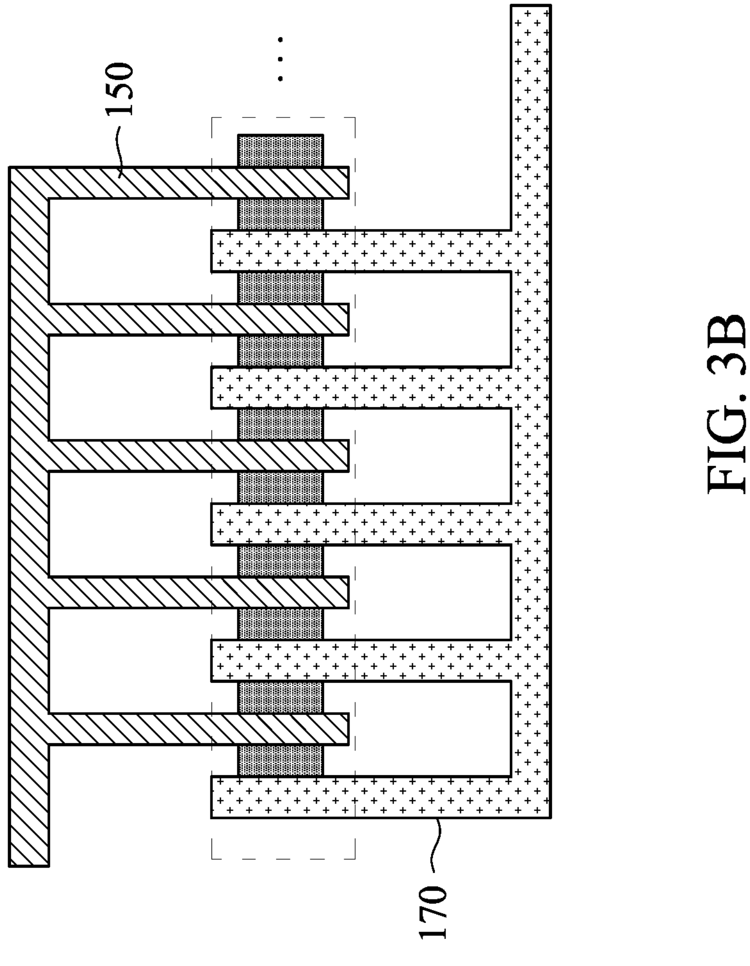
FIG. 3B is a plan view of a second embodiment of a micromechanical arm array having a first array of piezoelectric fingers interposed with a second array of electrically conductive fingers. The ratio of piezoelectric fingers to electrically conductive fingers is 1:1.

FIG. 3B is a plan view of a second embodiment of a micromechanical arm array 148. Here, the ratio of piezoelectric fingers 150 to electrically conductive fingers 170 is 1:1. One piezoelectric finger is present between each set of two electrically conductive fingers.

Figure 3C:
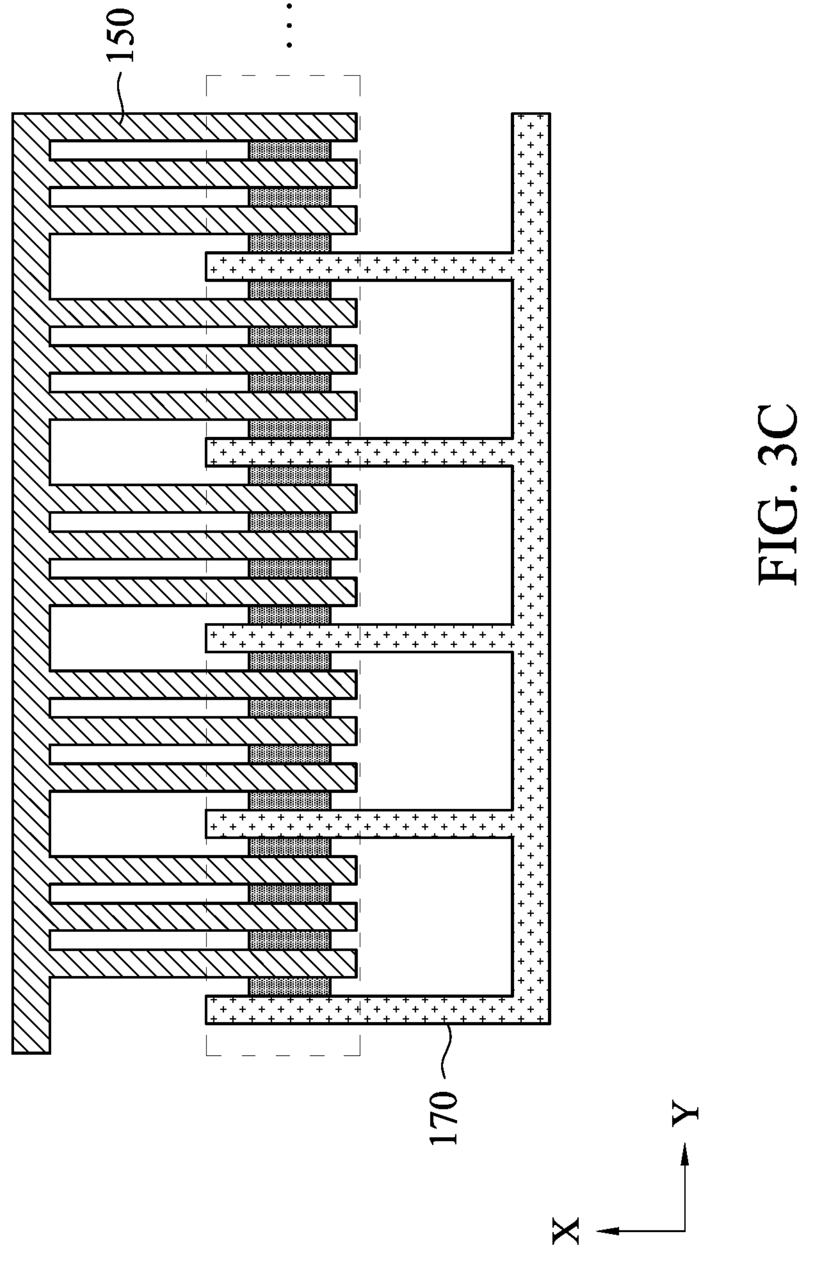
FIG. 3C is a plan view of a third embodiment of a micromechanical arm array having a first array of piezoelectric fingers interposed with a second array of electrically conductive fingers. The ratio of piezoelectric fingers to electrically conductive fingers is 3:1.

FIG. 3C is a plan view of a third embodiment of a micromechanical arm array 148. Here, the ratio of piezoelectric fingers 150 to electrically conductive fingers 170 is 3:1, i.e. the integer 3. Three piezoelectric fingers are present between each set of two electrically conductive fingers. Generally, then, the ratio of piezoelectric fingers 150 to electrically conductive fingers 170 may range from about 1:1 or higher. A maximum ratio may be about 10:1. It is noted that an "array" of fingers may contain as few as one finger. Generally, each array of fingers can contain from 1 finger to about 60 fingers, or to about 100 fingers, or to as many as 1000 fingers, as desired.

Figure 4A:
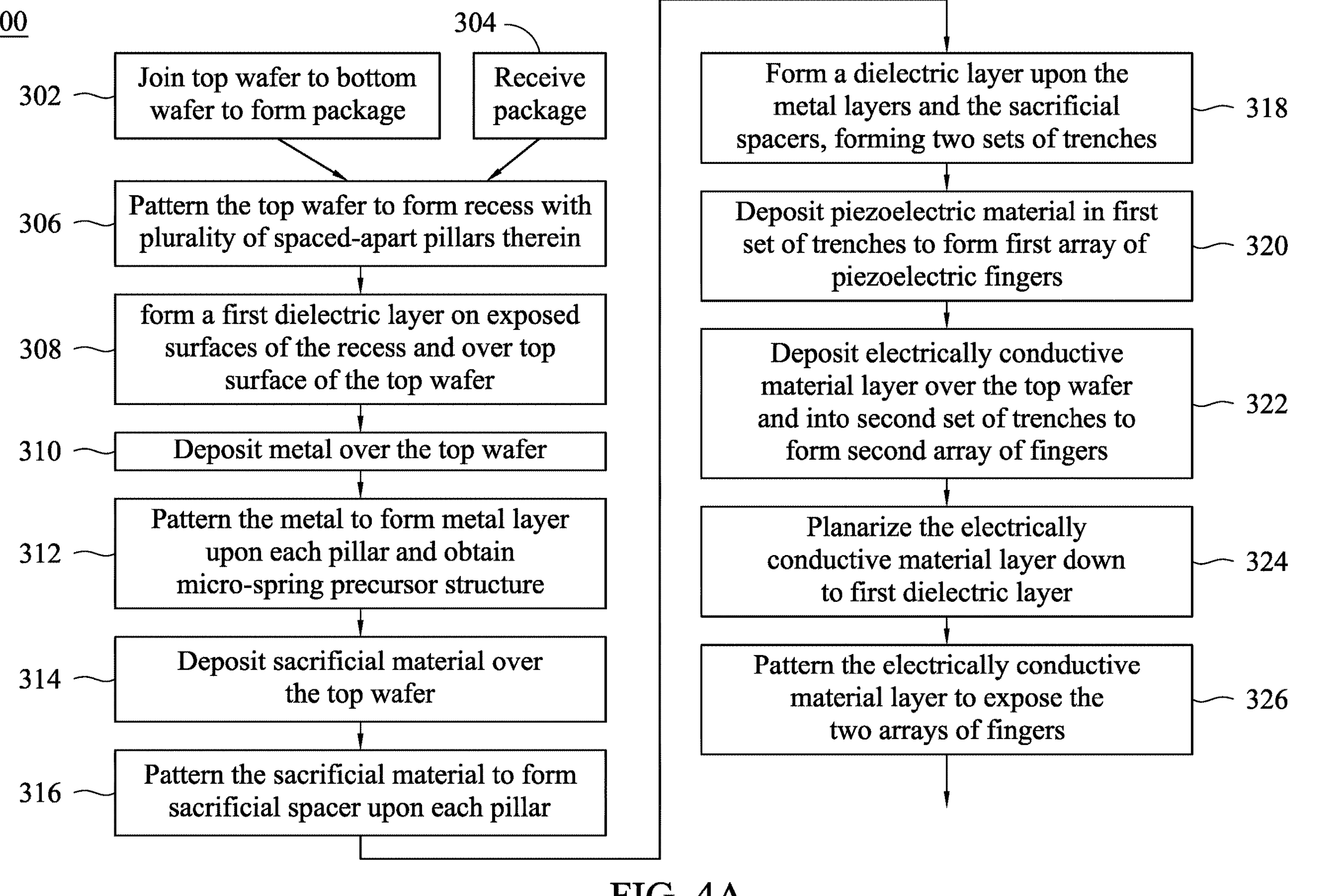
FIGS. 4A-4C together are a flow chart illustrating a first method for making a micromechanical arm array for a MEMS actuator, in accordance with some embodiments.
Figure 4B:
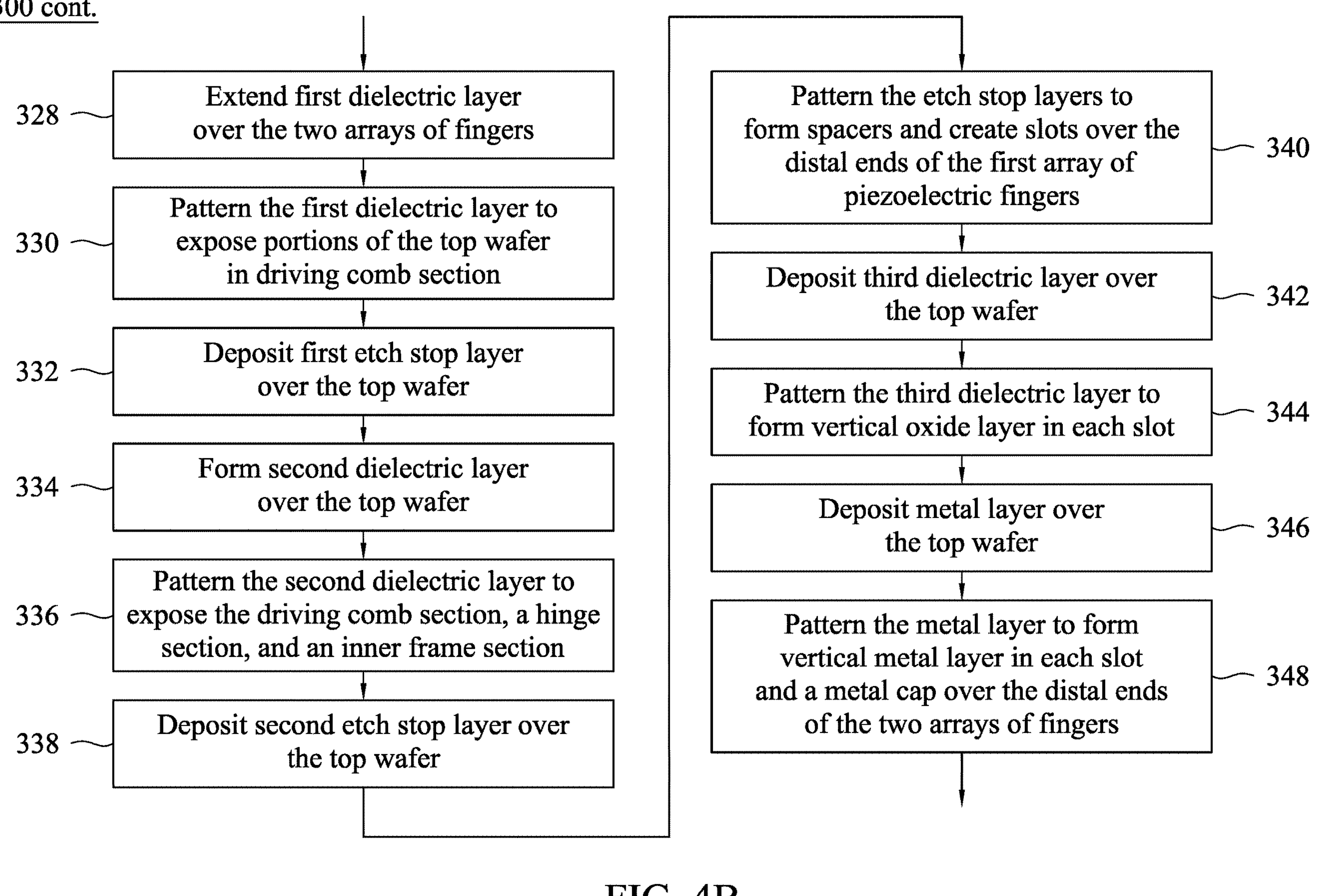
Figure 4C:
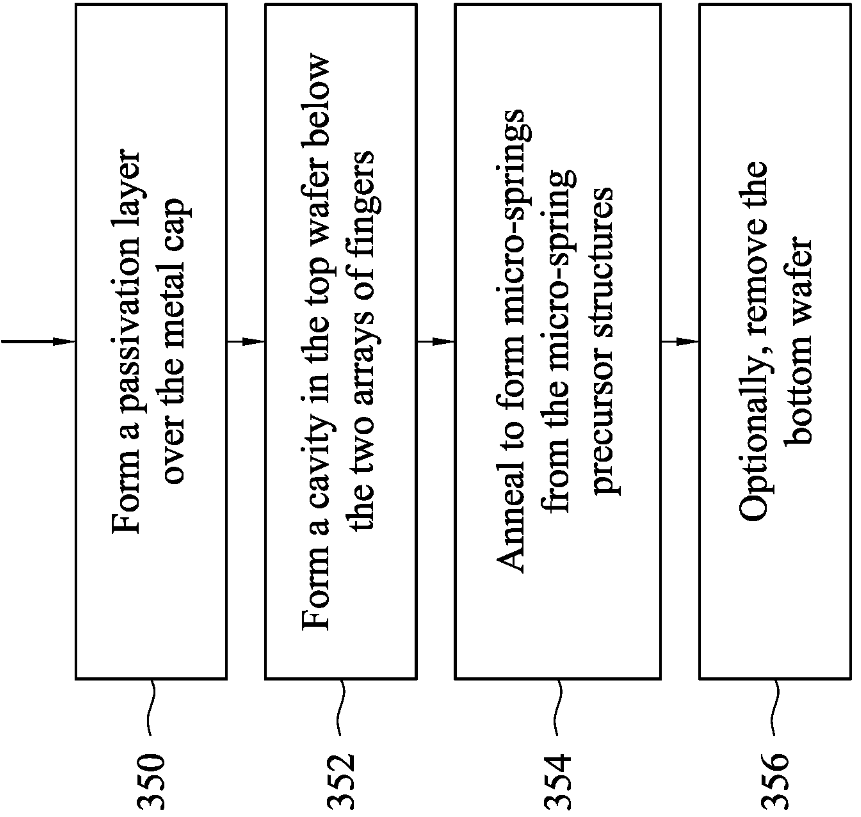

FIGS. 4A-4C together are a flow chart illustrating a first method 300 for making a micromechanical arm array for a MEMS actuator, in accordance with some embodiments. Some steps of the method are also illustrated in FIGS. 5-30B. These figures provide different views for better understanding. While the method steps are discussed below in terms of forming a single micromechanical arm array with a small number of fingers, such discussion should also be broadly construed as applying to the concurrent formation of multiple micromechanical arm arrays located in a single driving comb section, and also to the formation of many fingers. These figures do not show the formation of the entire actuator, only the driving comb section.

Figure 5:
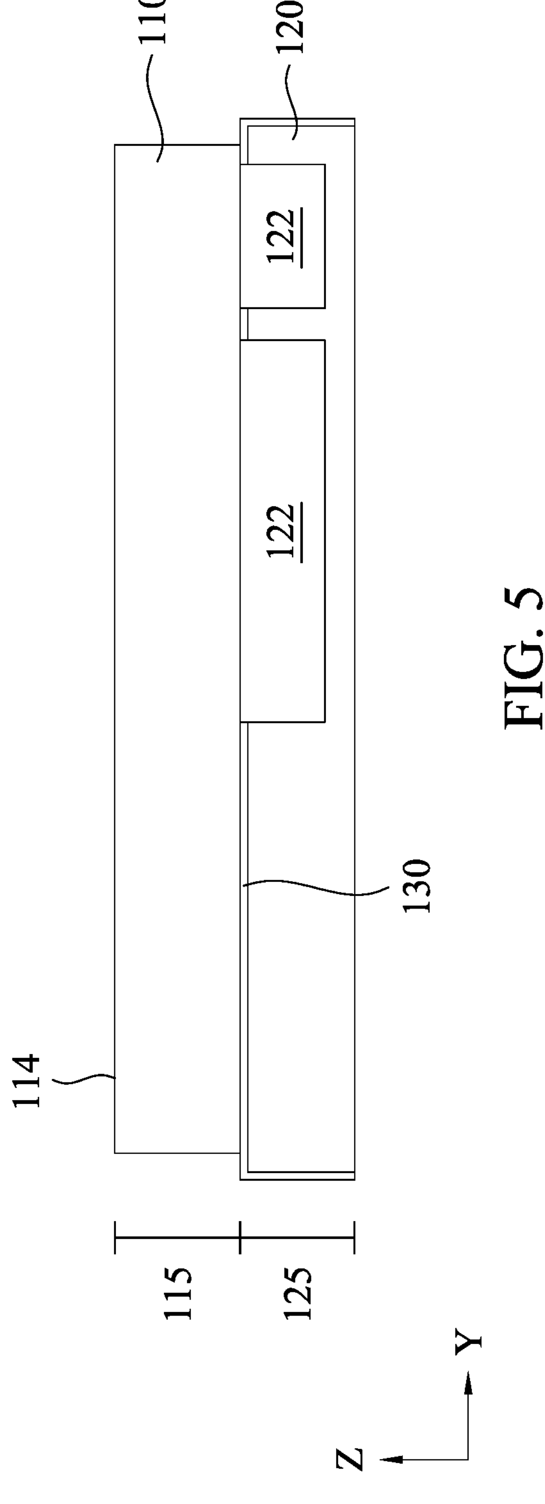
FIG. 5 is a side cross-sectional view of a package used for making the micromechanical arm array.

Initially, in step 302 of FIG. 4A and as illustrated in FIG. 5, a top wafer 110 is joined to a bottom wafer 120 to form a package 100. Alternatively, as shown in step 304 of FIG. 4A, a package is received.

The top wafer 110 and the bottom wafer 120 may independently be, for example, a wafer made of a semiconducting material. Such semiconductor materials can include silicon, for example in the form of crystalline Si. In alternative embodiments, the substrate can be made of other elementary semiconductors such as germanium, or may include a compound semiconductor such as silicon carbide (SiC), gallium arsenide (GaAs), gallium carbide, gallium phosphide, indium arsenide (InAs), indium phosphide (InP), silicon germanium, silicon germanium carbide, gallium arsenic phosphide, or gallium indium phosphide. In particular embodiments, the two wafers are made of silicon.

The top wafer includes a top surface 114 which also acts as the top surface of the package. Generally, the top wafer 110 has a relatively lower thickness 115 (for example in the range of about 200 μm) which results in the top wafer being very flexible and thus difficult to process by itself. The bottom wafer 120 has a relatively higher thickness 125 (for example in the range of about 500 μm) that increases the overall thickness of the package and thus provides mechanical stability during processing, and can also aid in electrical isolation (if desired). Two cavities 122 are already present within the bottom wafer 120. The bonding layer 130 may be formed by fusion bonding, for example, by a heating and/or pressing process without any additional layers. As another example, both wafers may have a dielectric layer on appropriate surfaces which are then heated. The two wafers are then pressed together to form the bonding layer.

Next, in step 306 of FIG. 4A and as illustrated in FIGS. 6A-6D, the top wafer 110 is patterned to form a recess 220. A plurality of pillars 222 is formed within the recess. The pillars are spaced apart from each other. Depending on the desired heights of the fingers of the micromechanical arm array, the pillars may be formed upon a stand 224. The recess is part of the driving comb section 134. Additional trenches 135 are also formed in the driving comb section. Additional trenches 137, 139, 143 are also formed in the top wafer in locations which will correspond to the hinge section, the inner frame section, the spring section, and the outer frame section. The pillars correspond to locations where the horizontal micro-springs will be formed.

Figure 6A:
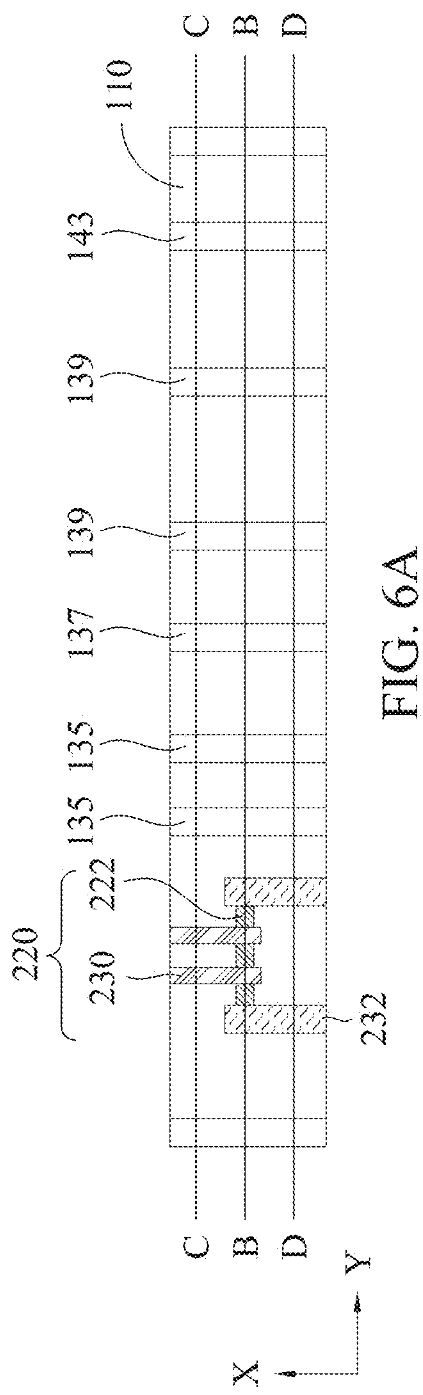
FIG. 6A is a plan view of the package after a first etching step.
Figure 6B:
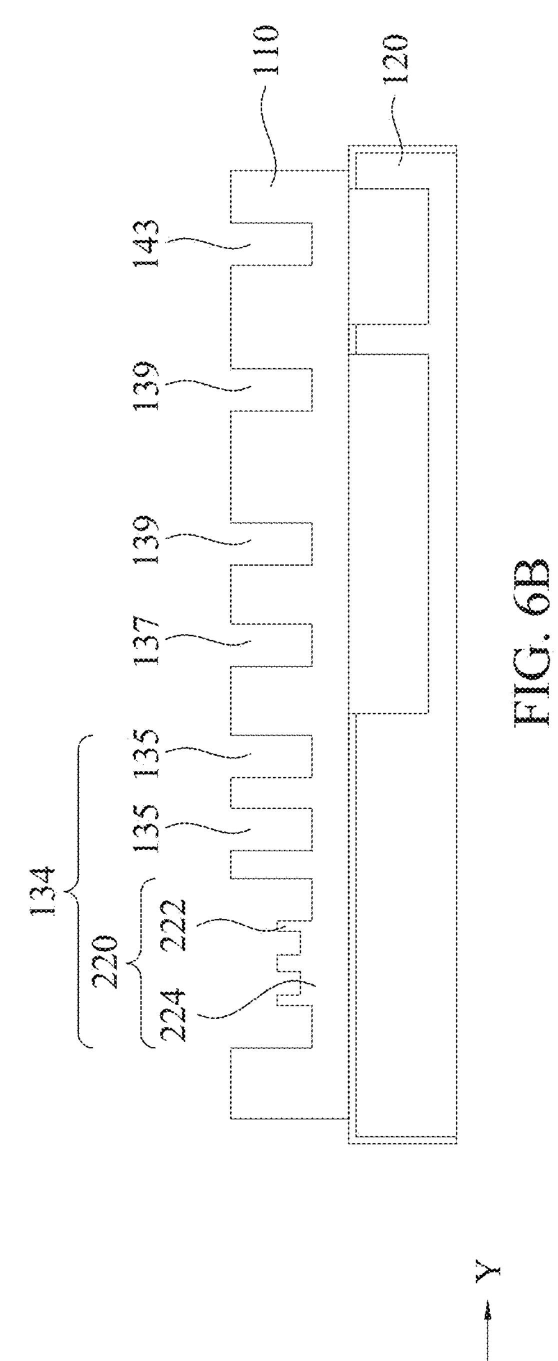
FIG. 6B is a side cross-sectional view of the package through line B-B of FIG. 6A.
Figures 6C, 6D:
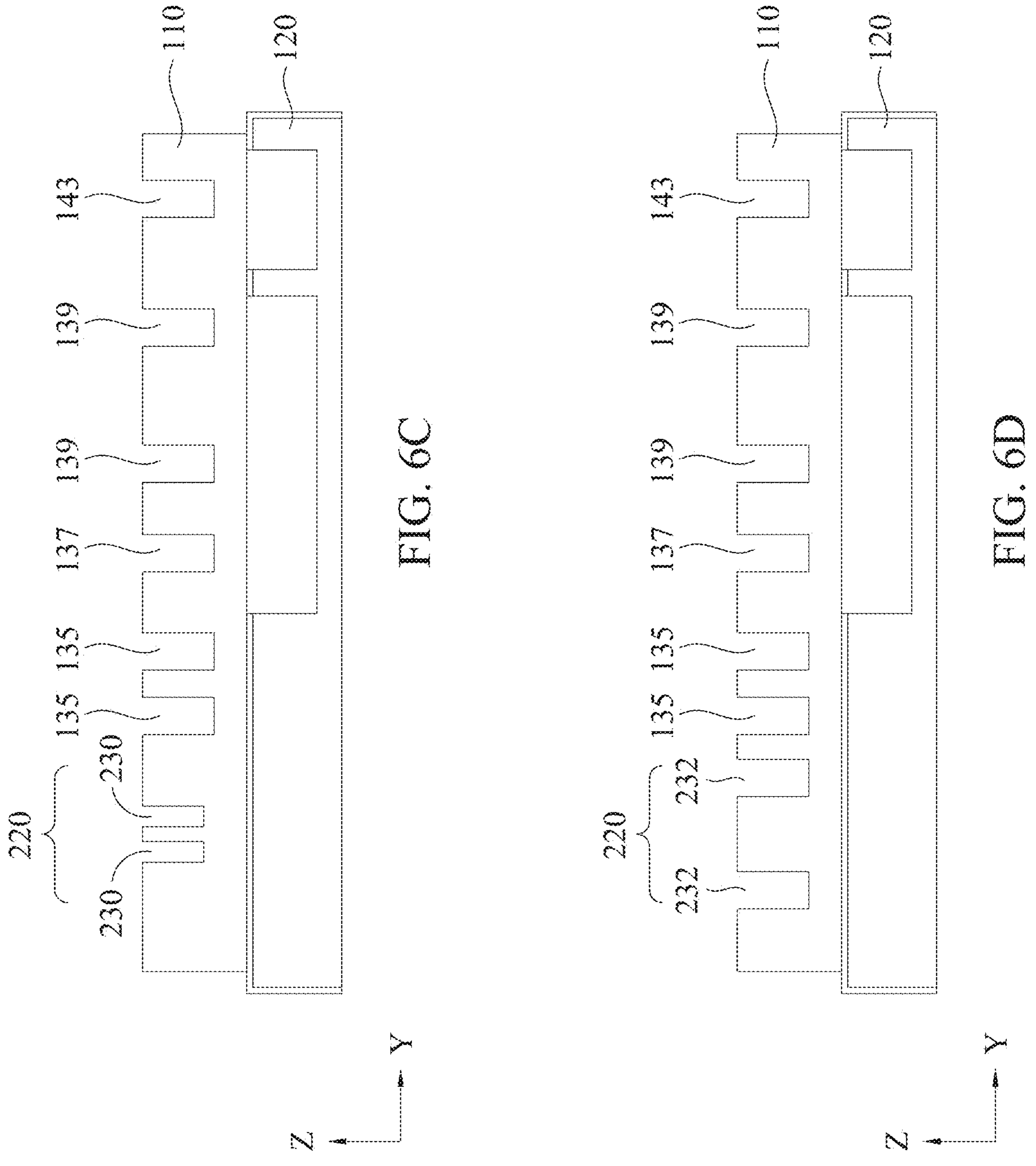
FIG. 6C is a side cross-sectional view of the package through line C-C of FIG. 6A.
FIG. 6D is a side cross-sectional view of the package through line D-D of FIG. 6A.

FIG. 6A is a plan view of the package after this patterning/etching step. As illustrated here, the recess is shaped to form two different sets of trenches 230, 232 within the recess, which will correspond to the two different arrays of fingers. It is noted that a "set" of trenches may be as few as one trench. The different depths of the recess 220, the stand (see trench 230), and the pillars 222 are indicated with different shading. FIG. 6B is a side cross-sectional view of the package through line B-B of FIG. 6A. This cross-section passes through the location where the distal ends of the fingers and the micro-springs will be formed. FIG. 6C is a side cross-sectional view of the package through line C-C of FIG. 6A. In this cross-section, only the trenches 230 for the first array of fingers are visible in the recess 220. FIG. 6D is a side cross-sectional view of the package through line D-D of FIG. 6A. In this cross-section, only the trenches 232 for the second array of fingers are visible in the recess 220. It is noted that the cross-sectional views of FIGS. 7-30B are also through line B-B of FIG. 6A.

Figure 7:
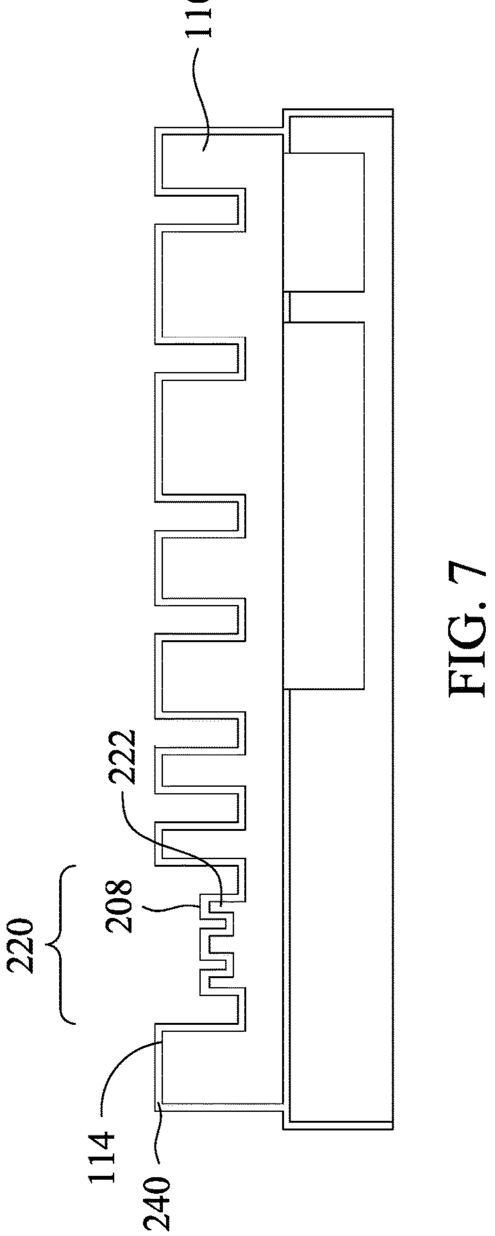
FIG. 7 is a side cross-sectional view of the package after formation of a first dielectric layer.

Next, in step 308 of FIG. 4A and as illustrated in FIG. 7, a first dielectric layer 240 is formed on the exposed surfaces of the recess 220. The first dielectric layer is also formed on the other exposed surfaces of the top wafer 110, including the top surface 114. In particular embodiments, the first dielectric layer is made of silicon dioxide ($SiO_2$), which can be formed by thermal oxidation of the silicon wafer. Of particular note, the portion of the first dielectric layer 240 upon the pillars 222 will form the dielectric layer 208 of a horizontal micro-spring.

Figure 8:
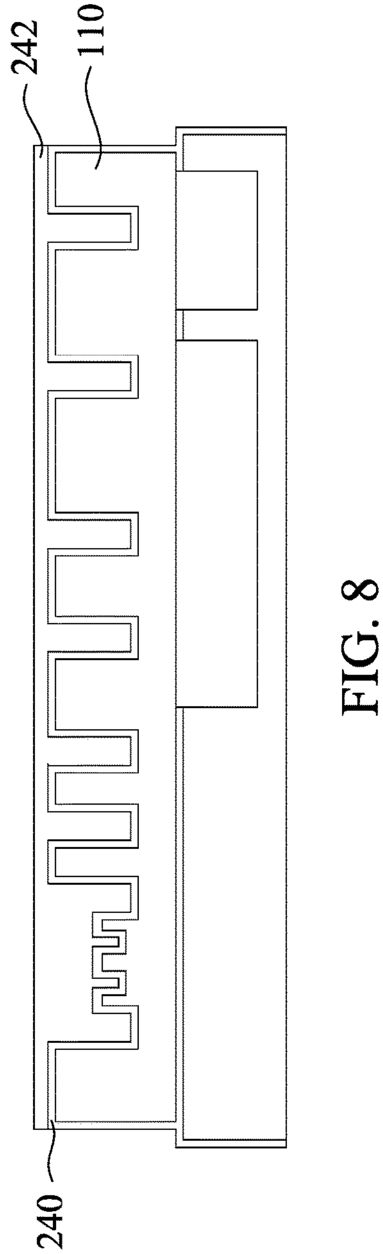
FIG. 8 is a side cross-sectional view of the package after metal deposition.
Figure 9A:
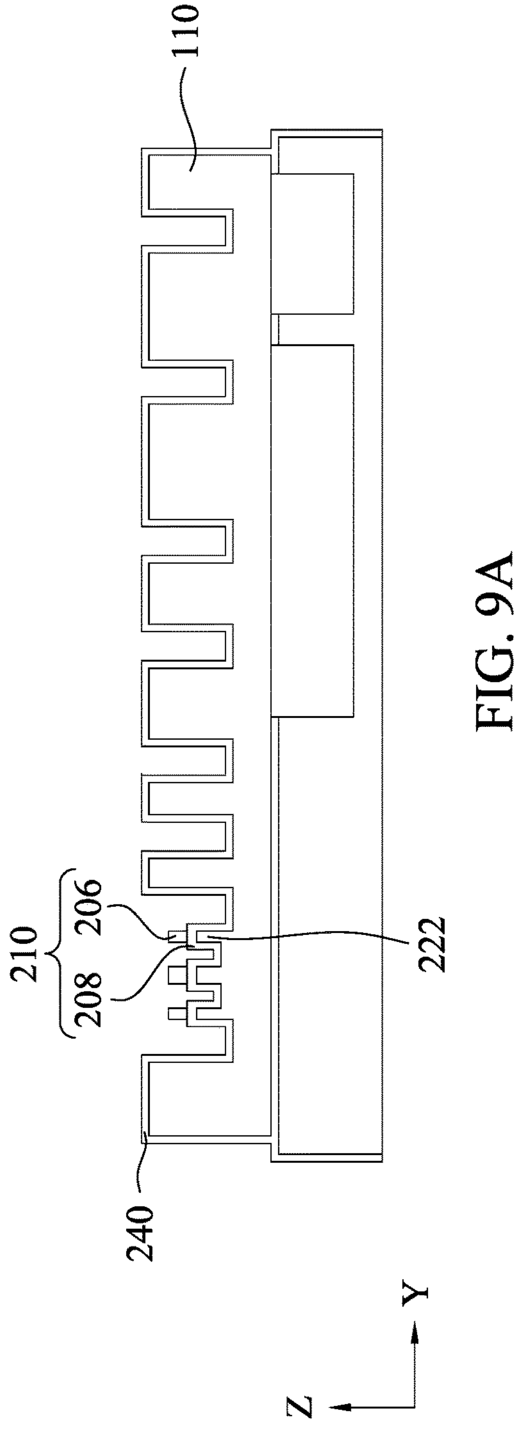
FIG. 9A is a side cross-sectional view of the package after etching to form metal layers on pillars.
Figure 9B:
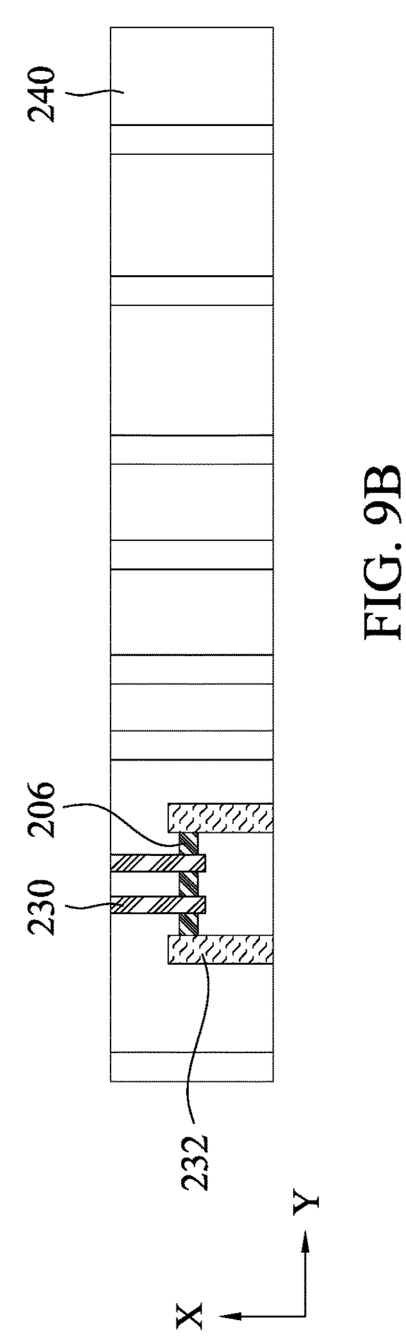
FIG. 9B is a plan view.

Next, in step 310 of FIG. 4A and as illustrated in FIG. 8, metal 242 is deposited over the top wafer. Then, in step 312 of FIG. 4A and as illustrated in FIG. 9A and FIG. 9B, the metal is patterned to form a metal layer 206 upon each pillar 222. This metal layer will form the second layer of a horizontal micro-spring. In particular embodiments, the metal is aluminum (Al) or an aluminum alloy, such as AlCu. The metal may be deposited, for example, via evaporation or sputtering, plating, chemical vapor deposition (CVD), physical vapor deposition (PVD), atomic layer deposition (ALD), or other suitable methods. As better seen in FIG. 9B, the metal layer 206 is present only upon the pillars 222, and not in the trenches 230, 232 within the recess. The combination of the dielectric layer 208 and the metal layer 206 upon each pillar is also referred to herein as a micro-spring precursor structure 210 or a horizontal composite structure.

Figure 10:
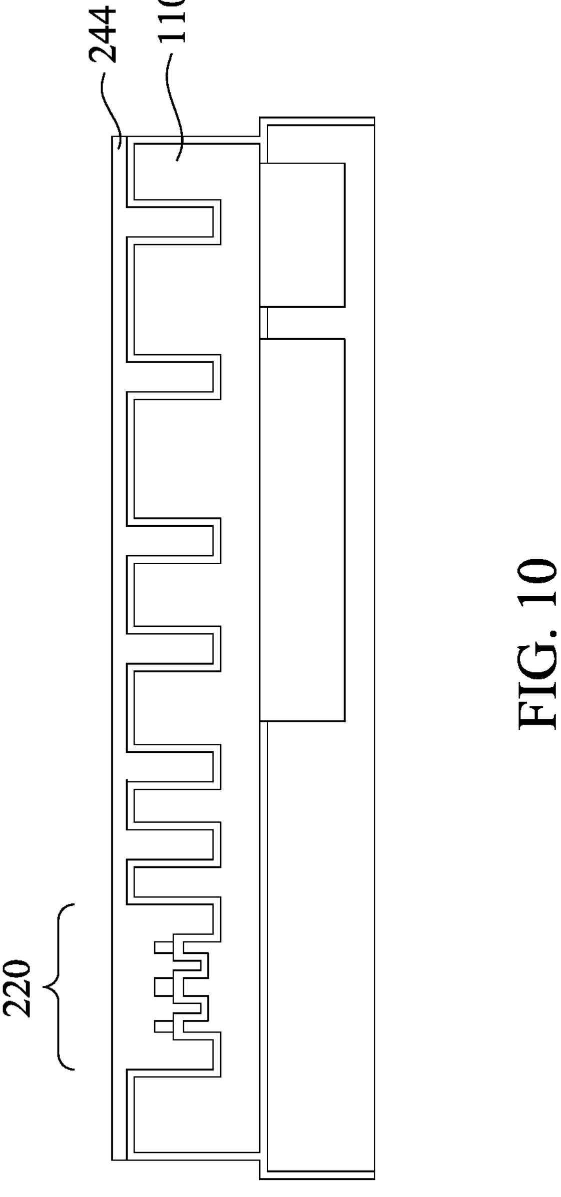
FIG. 10 is a side cross-sectional view of the package after silicon deposition.
Figure 11A:
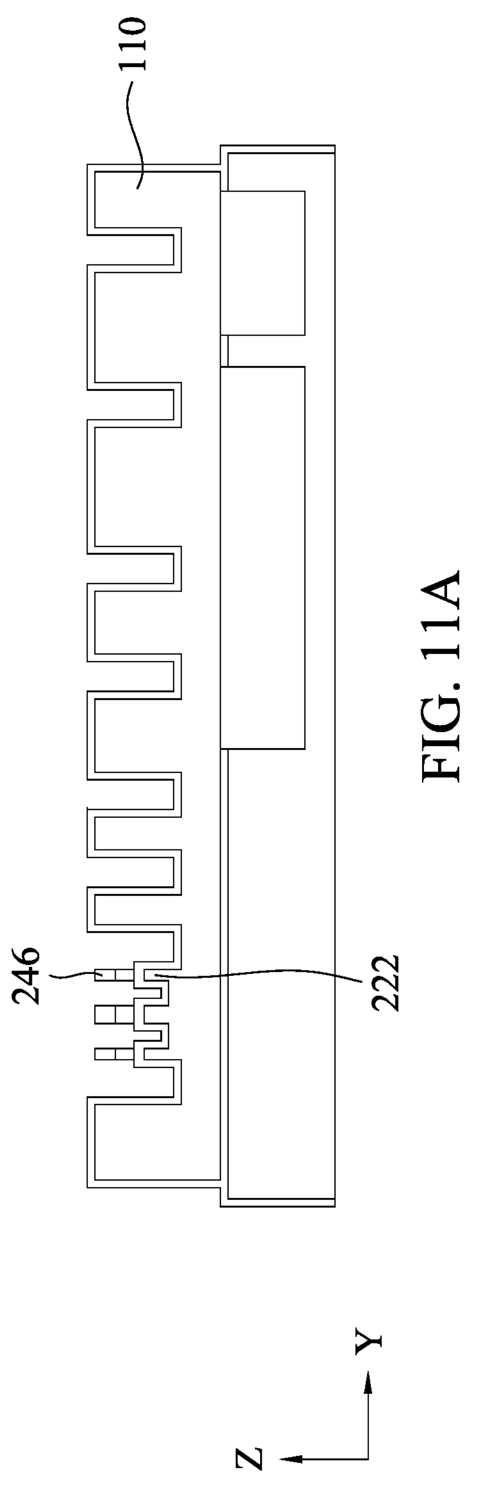
FIG. 11A is a side cross-sectional view of the package after etching to form sacrificial spacers on the pillars.
Figure 11B:
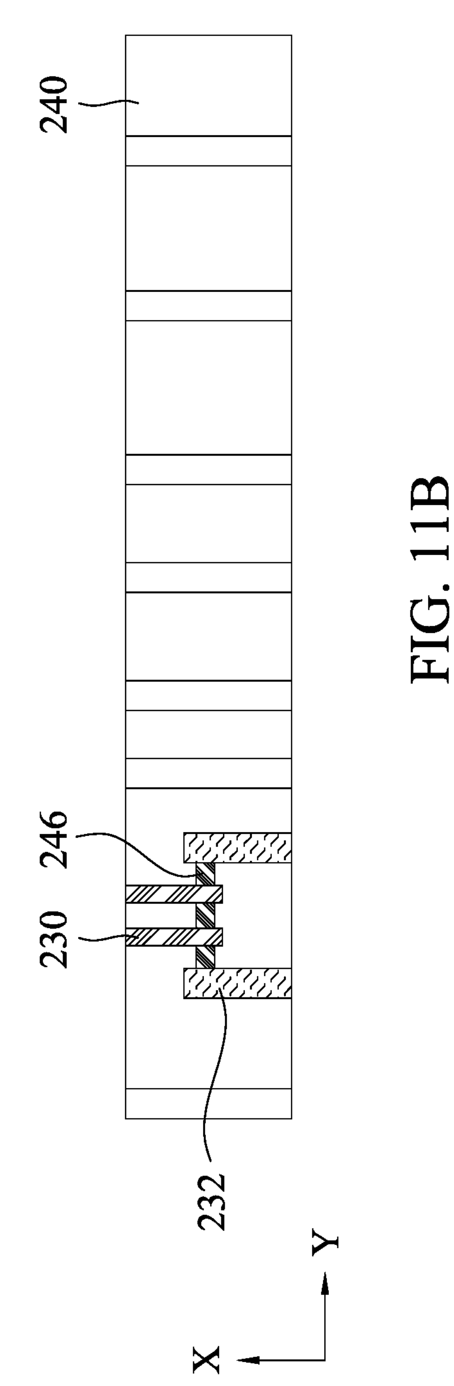
FIG. 11B is a plan view.

Continuing, in step 314 of FIG. 4A and as illustrated in FIG. 10, a sacrificial material 244 is deposited over the top wafer, including within the recess 220. The sacrificial material may be deposited using CVD, PVD, or other suitable methods. Then, in step 316 of FIG. 4A and as illustrated in FIG. 11A and FIG. 11B, the sacrificial material is patterned to form a sacrificial spacer 246 upon each pillar. As better seen in FIG. 11B, sacrificial spacers 246 are formed only upon the pillars 222, and not in the other areas of the recess. In particular embodiments, the sacrificial material is the same material as the top wafer, such as silicon.

Figure 12:
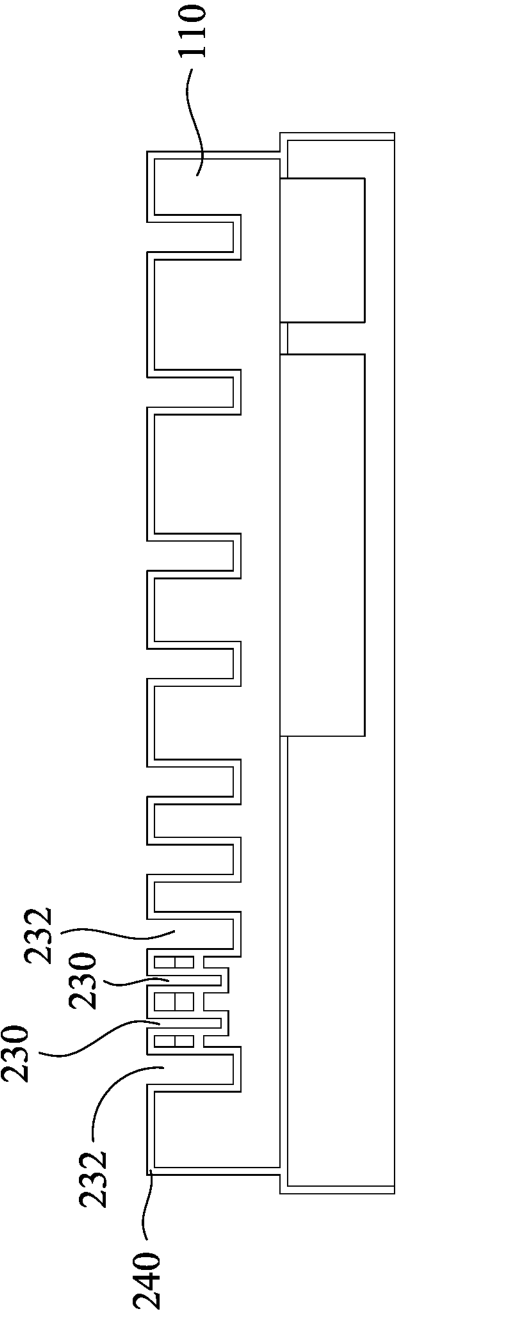
FIG. 12 is a side cross-sectional view of the package after addition to the first dielectric layer on newly exposed surfaces.

In step 318 of FIG. 4A and as illustrated in FIG. 12, a dielectric layer is formed on the exposed surfaces of the metal layers 206 and the sacrificial spacers 246. This step may be considered as adding to the first dielectric layer 240. In particular embodiments, this is done by thermal oxidation of the exposed surfaces. As a result, the first set of trenches 230 and the second set of trenches 232 are completely separated from each other within the recess.

Figure 13A:
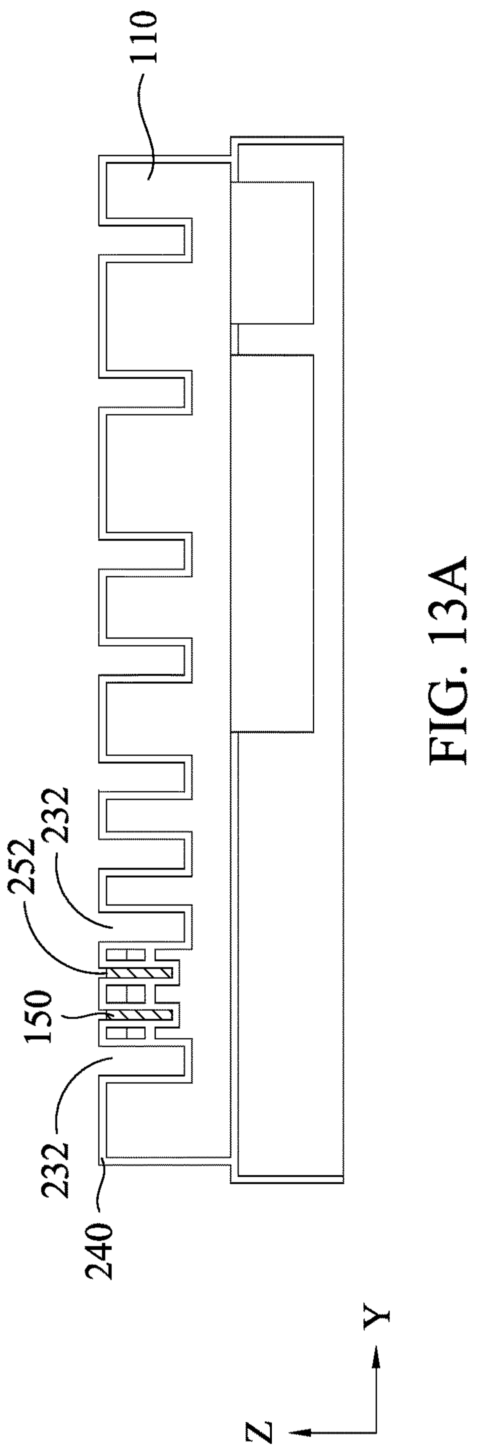
FIG. 13A is a side cross-sectional view of the package after deposition of piezoelectric material to form a first array of piezoelectric fingers.
Figure 13B:
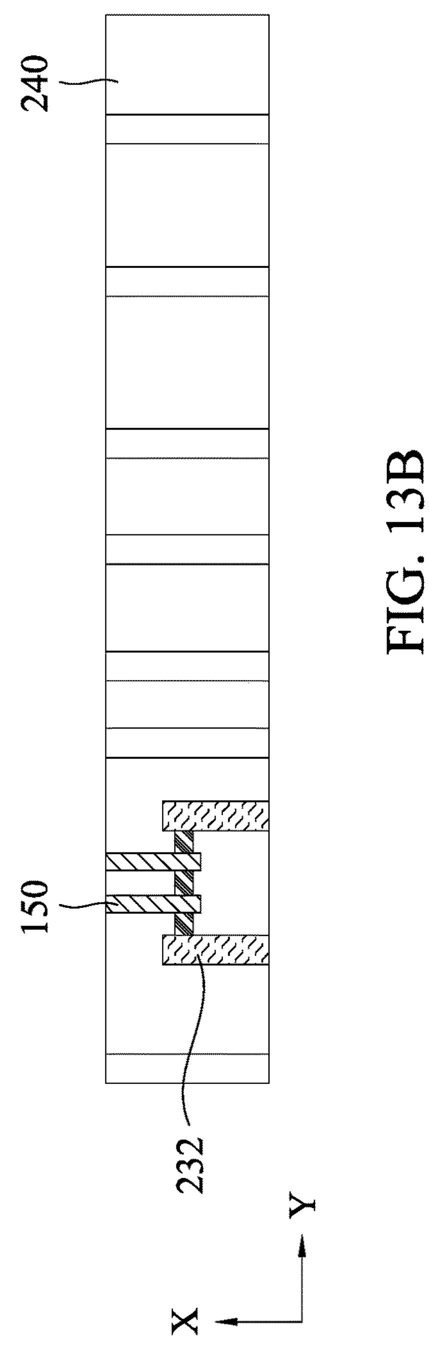
FIG. 13B is a plan view.

Next, in step 320 of FIG. 4A and as illustrated in FIG. 13A and FIG. 13B, a piezoelectric material 252 is deposited into the first set of trenches to form a first array of piezoelectric fingers 150. Referring back to FIGS. 3A-3C, the first arm 168 is also formed in this step. The deposition may be performed using CVD, PVD, or other suitable methods. Examples of suitable piezoelectric materials may include barium titanate ($BaTiO_3$, BTO), lead titanate ($PbTiO_3$), lead zirconium titanate (PZT), or potassium sodium niobate (KNN).

Figure 14:
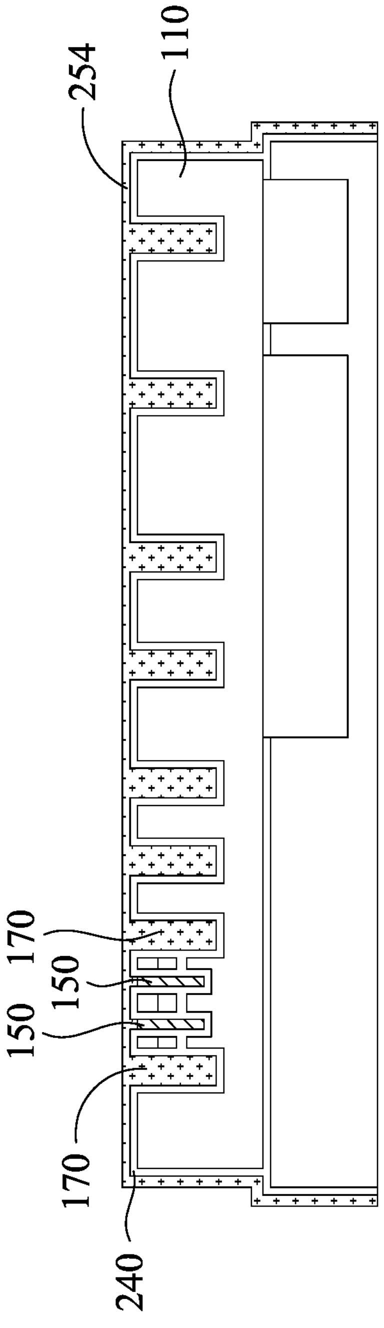
FIG. 14 is a side cross-sectional view of the package after deposition of electrically conductive material over the top wafer to form a second array of electrically conductive fingers.

Continuing, in step 322 of FIG. 4A and as illustrated in FIG. 14, an electrically conductive material is deposited into the second set of trenches to form a first array of electrically conductive fingers 170. Referring back to FIGS. 3A-3C, the second arm 188 is also formed in this step. The deposition may be performed using CVD, PVD, or other suitable methods. This electrically conductive material is not piezoelectric. As seen here, an electrically conductive material layer 254 is also formed over the top wafer, including over the piezoelectric fingers 150. In particular embodiments, the electrically conductive material is polysilicon.

Figures 15A, 15B:
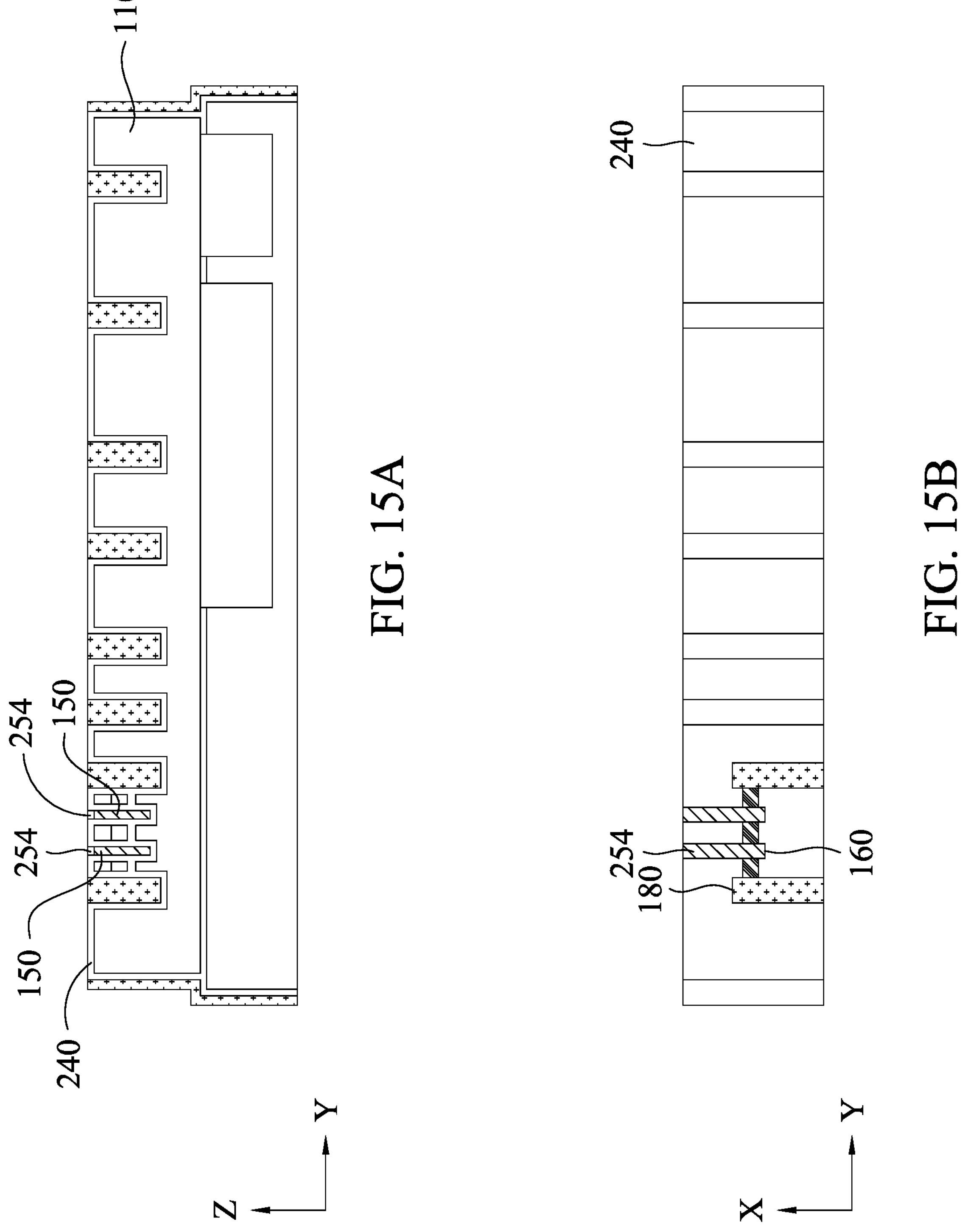
FIG. 15A is a side cross-sectional view of the package after CMP of the electrically conductive material.
FIG. 15B is a plan view.

In step 324 of FIG. 4A and as illustrated in FIG. 15A and FIG. 15B, the electrically conductive material layer is planarized down to the first dielectric layer 240. The first dielectric layer acts as an etch stop layer for this step. As seen here, after the planarization step, the electrically conductive material 254 is still present over the piezoelectric fingers 150 in the first set of trenches. It can be seen in FIG. 15B that the distal ends 160, 180 of the two arrays of fingers are interposed between each other.

Figure 16:
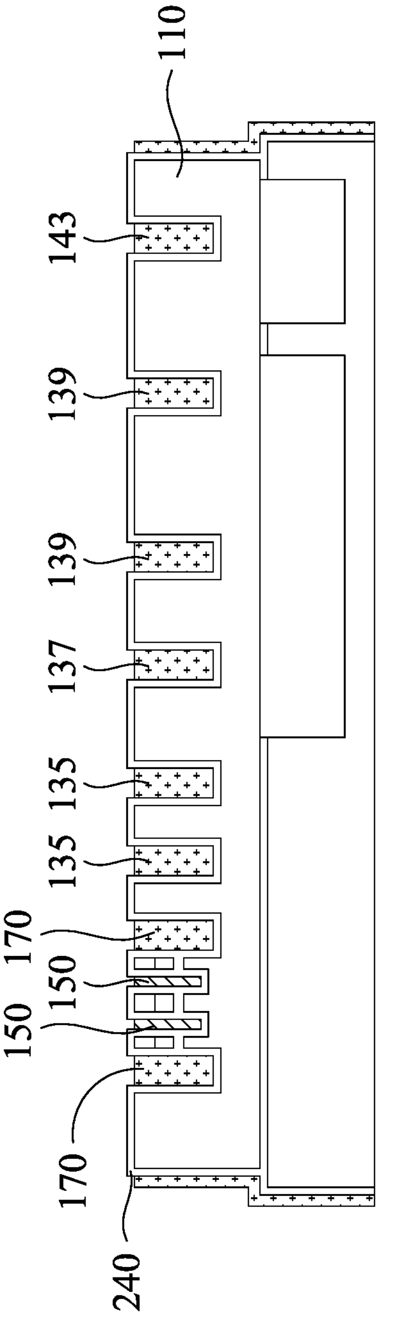
FIG. 16 is a side cross-sectional view of the package after etching to remove the electrically conductive material from trenches.

In step 326 of FIG. 4A and as illustrated in FIG. 16, the electrically conductive material layer 254 is further patterned to expose the two arrays of fingers 150, 170. Put another way, the level of electrically conductive material is reduced to below the level of the first dielectric layer 240. The level of electrically conductive material is also reduced in the other trenches 135, 137, 139, 143 in the top wafer.

Figure 17:
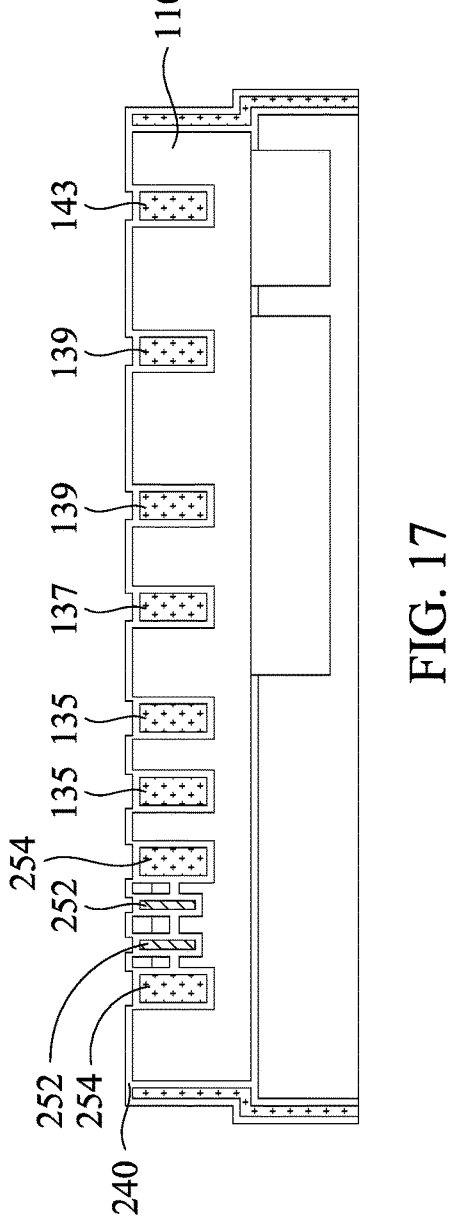
FIG. 17 is a side cross-sectional view of the package after further addition to the first dielectric layer over the two arrays of fingers.

Subsequently, in step 328 of FIG. 4B and as illustrated in FIG. 17, a dielectric layer is formed upon the exposed surfaces of the piezoelectric material 252 and the electrically conductive material 254. This step may be considered as adding to the first dielectric layer 240. In particular embodiments, this is done by thermal oxidation of the exposed surfaces. The addition to the first dielectric layer also occurs on the other trenches 135, 137, 139, 143 in the top wafer.

Figure 18:
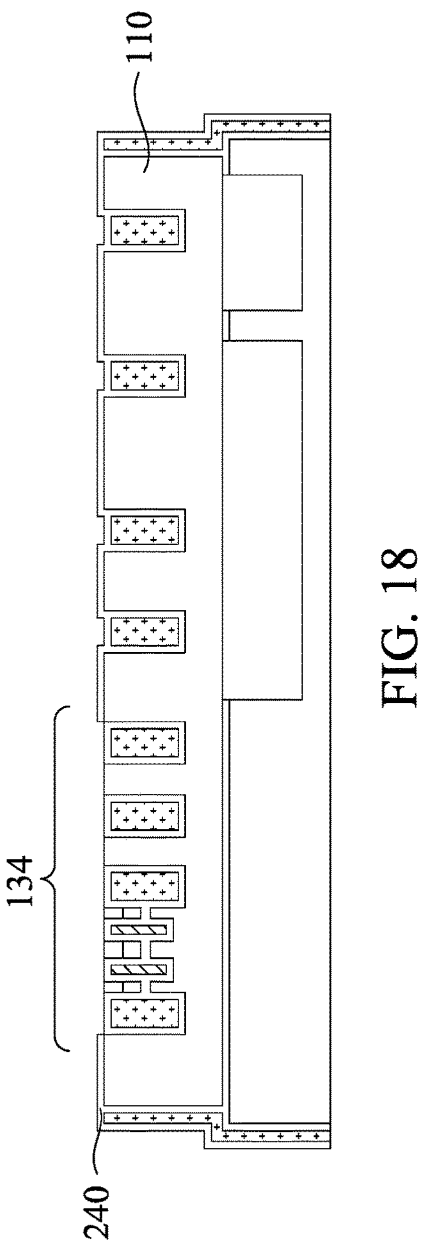
FIG. 18 is a side cross-sectional view of the package after partial etching of the first dielectric layer to expose portions of the top wafer.

Then, in step 330 of FIG. 4B and as illustrated in FIG. 18, the first dielectric layer 240 is patterned to expose portions of the top wafer 110 within the driving comb section 134. As will be seen later, this is done to permit the silicon to be removed later. Portions of the first dielectric layer are removed from the driving comb section to expose the top wafer.

Figure 19:
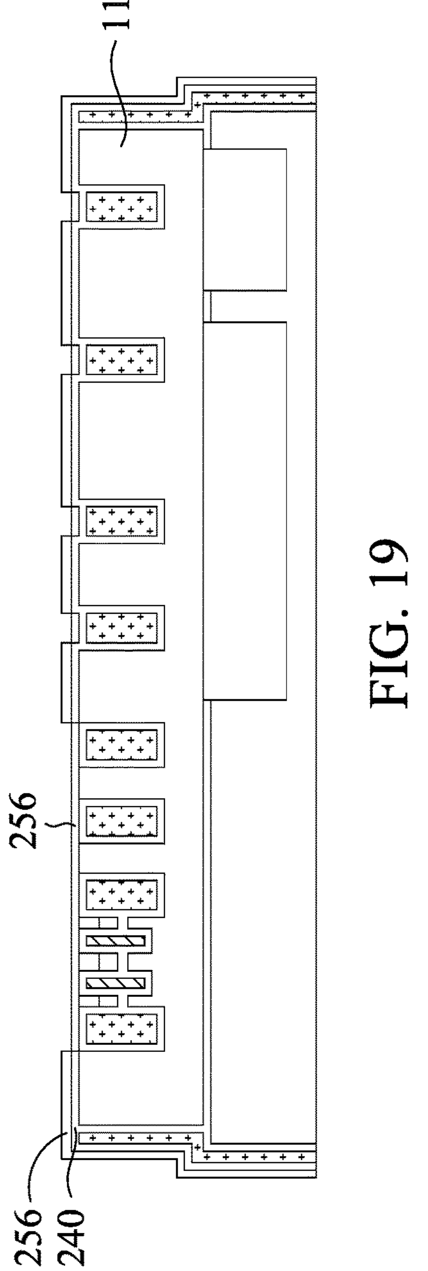
FIG. 19 is a side cross-sectional view of the package after deposition of a first etch stop layer over the top wafer.

Next, in step 332 of FIG. 4B and as illustrated in FIG. 19, a first etch stop layer 256 is deposited over the top wafer. The deposition may be performed using CVD, PVD, or other suitable methods. The first etch stop layer may be made of any material that is different from the material of the first dielectric layer 240, such as a different dielectric material or an electrically conductive material. In particular embodiments, the first stop etch layer is made of polysilicon.

Figure 20:
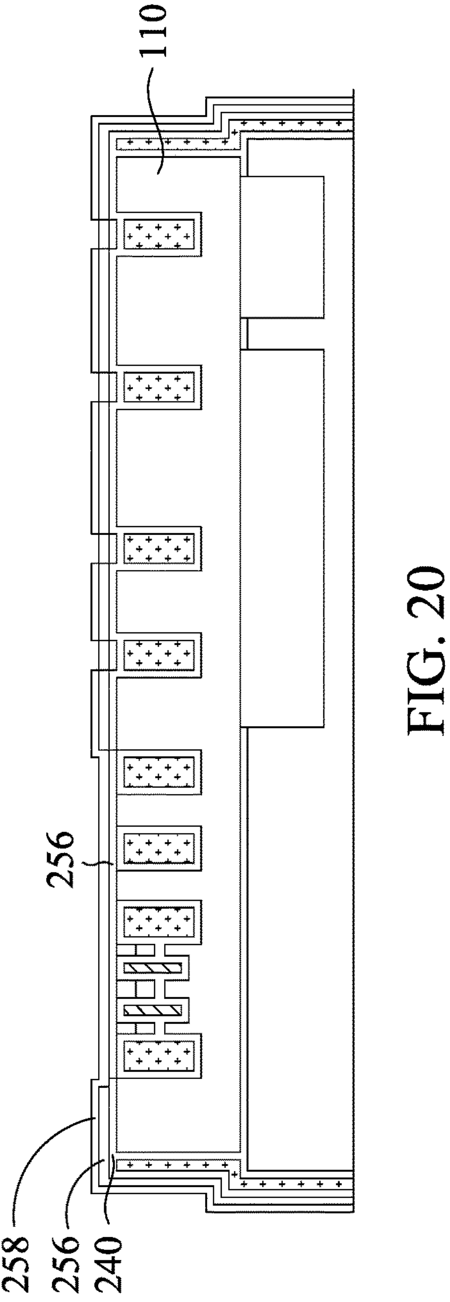
FIG. 20 is a side cross-sectional view of the package after formation of a second dielectric layer.
Figures 21A, 21B:
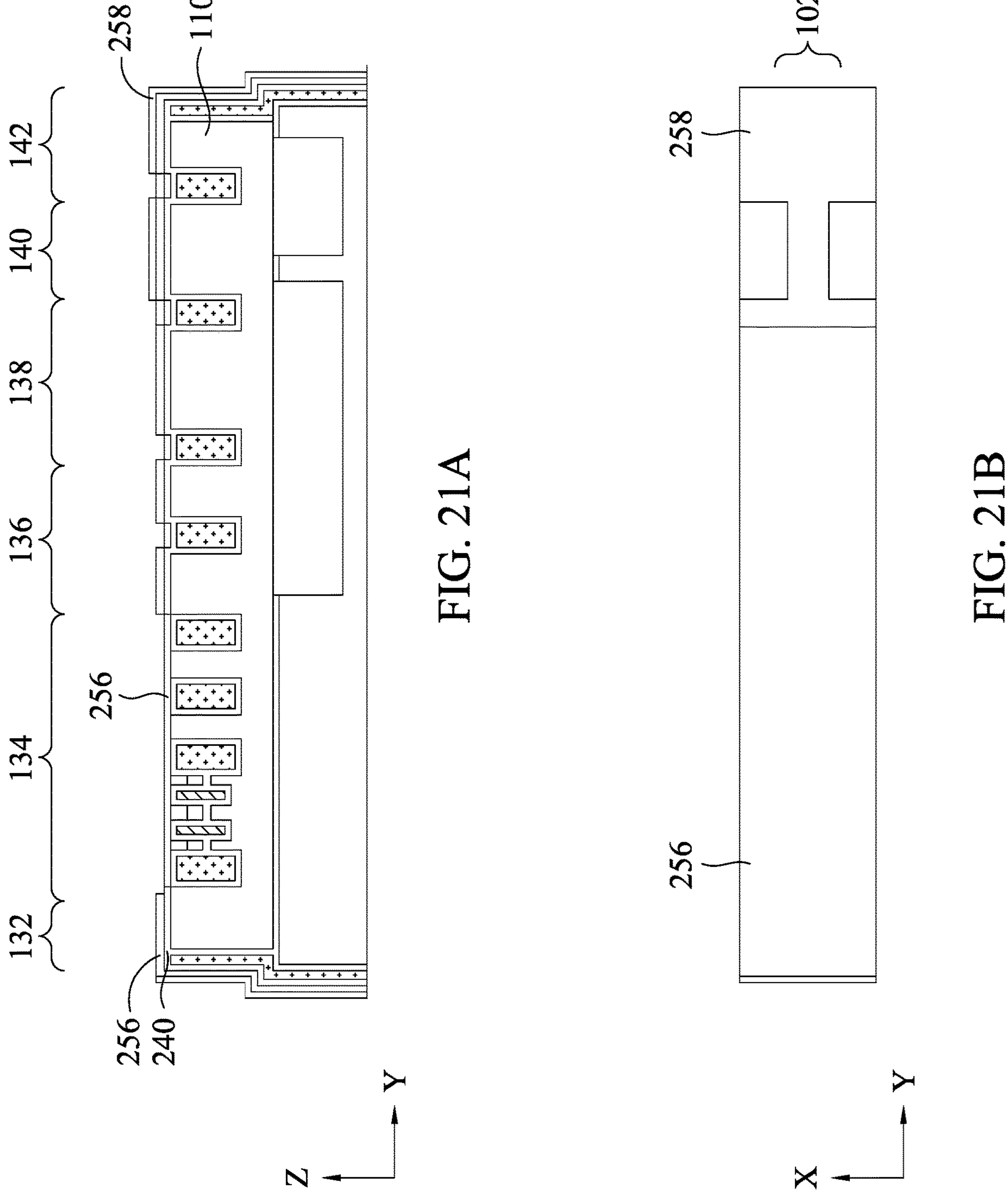
FIG. 21A is a side cross-sectional view of the package after partial etching of the second dielectric layer.
FIG. 21B is a plan view.

In step 334 of FIG. 4B and as illustrated in FIG. 20, a second dielectric layer 258 is formed over the first etch stop layer 256. This may be done by deposition such as CVD, PVD, or other suitable methods. Then, in step 336 of FIG. 4B and as illustrated in FIG. 21A and FIG. 21B, the second dielectric layer is patterned to expose the driving comb section 134, the hinge section 136, and a portion of the inner frame section 138. Put another way, the second dielectric layer is removed from these three sections. As a result, the second dielectric layer 258 remains upon a portion of the inner frame section 138, the spring section 140 and the outer frame section 142. In the spring section 140, the second dielectric layer 258 is present across a central section 102 aligned with the distal ends of the fingers 150, 170. The first etch stop layer 256 is exposed where the second dielectric layer has been removed. Generally, the first dielectric layer 240 and the second dielectric layer 258 are made of the same material.

Figure 22:
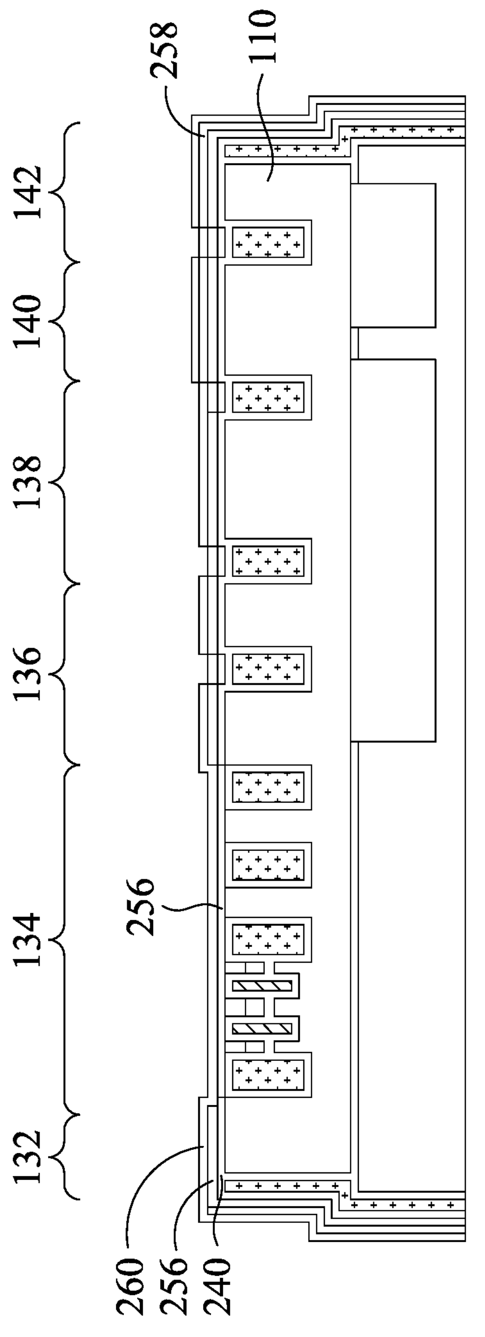
FIG. 22 is a side cross-sectional view of the package after deposition of a second etch stop layer over the top wafer.

Next, in step 338 of FIG. 4B and as illustrated in FIG. 22, a second etch stop layer 260 is deposited over the top wafer. The deposition may be performed using CVD, PVD, or other suitable methods. In particular embodiments, the second etch stop layer is made of the same material as the first etch stop layer 256. As illustrated here, then, there are several locations in the anchor arm section 132, the driving comb section 134, the hinge section 136, and the inner frame section 138 where the two etch stop layers 256, 260 directly contact each other.

Figure 23A:
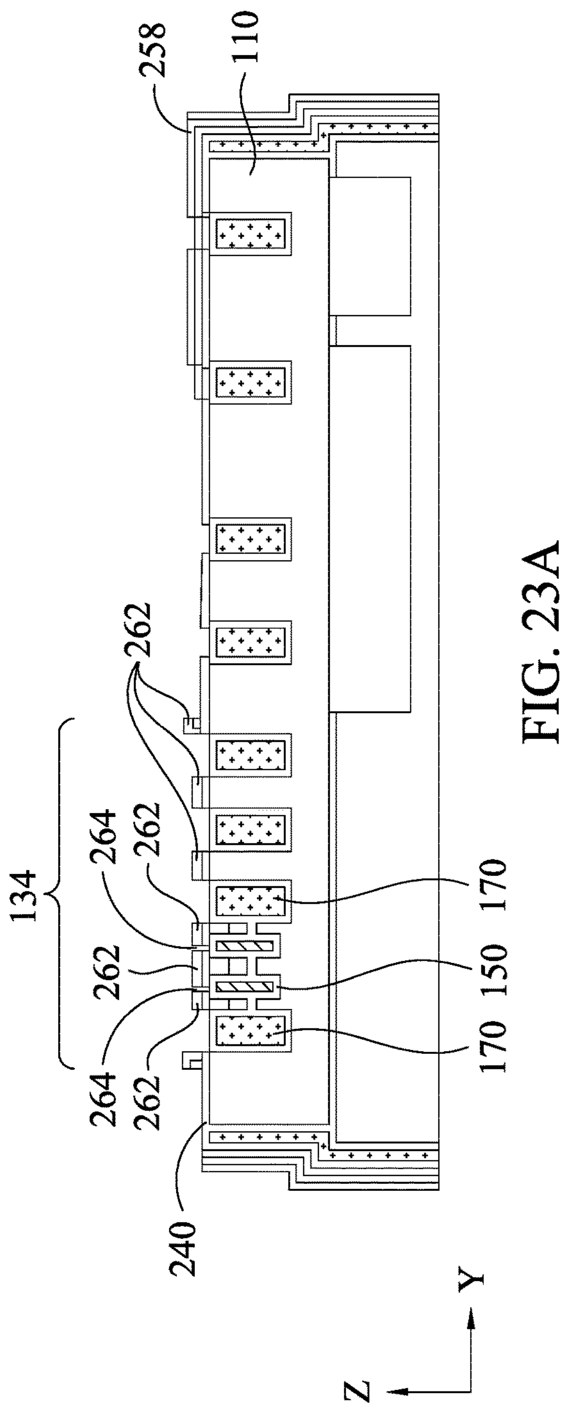
FIG. 23A is a side cross-sectional view of the package after etching of the etch stop layers to expose various portions of the top wafer.
Figure 23B:
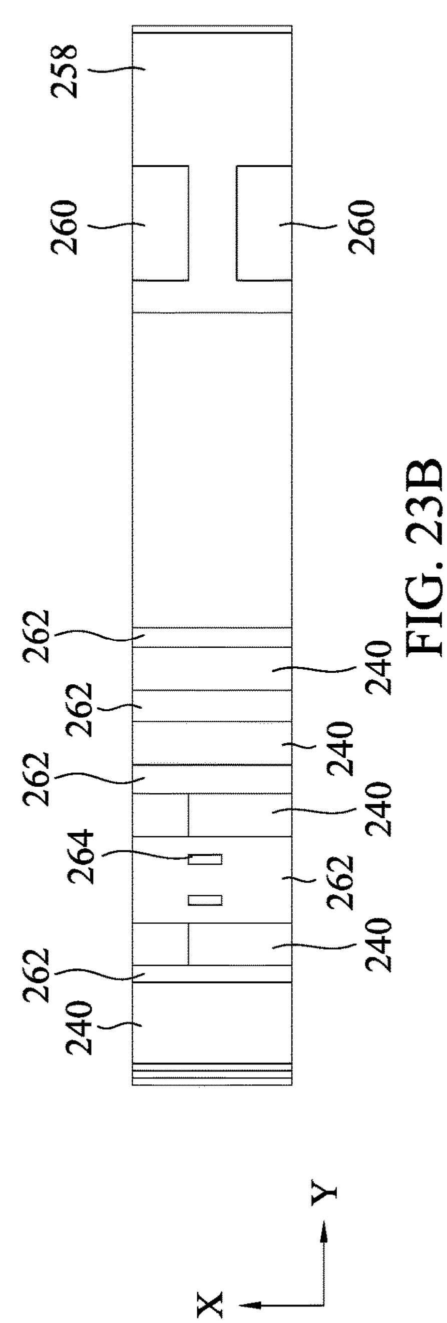
FIG. 23B is a plan view.

Then, in step 340 of FIG. 4B and as illustrated in FIG. 23A and FIG. 23B, the two etch stop layers are patterned to form vertical spacers 262 within the driving comb section. As seen here, spacers 262 are present over the portions of the top wafer 110 between the arrays of fingers 150, 170 and the trenches 135 in the driving comb section 134. Slots 264 are present between these spacers, which are located above the distal ends of the first array of piezoelectric fingers 150 in the driving comb section 134. Spacers 262 are also present upon the first dielectric layer 240 adjacent the driving comb section 134. As seen in FIG. 23B, the second etch stop layer 260 is also visible in the spring section 140 to either side of the central section 146 aligned with the distal ends of the fingers 150, 170.

Figure 24:
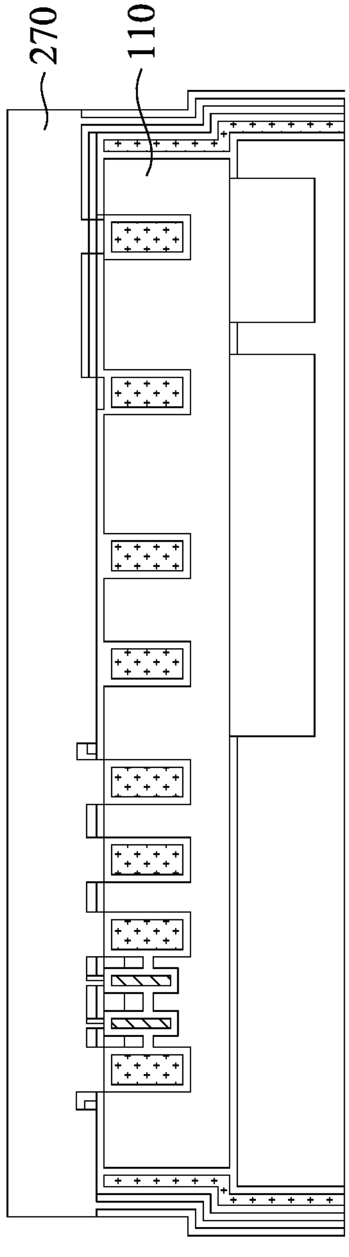
FIG. 24 is a side cross-sectional view of the package after deposition of a third dielectric layer.
Figure 25A:
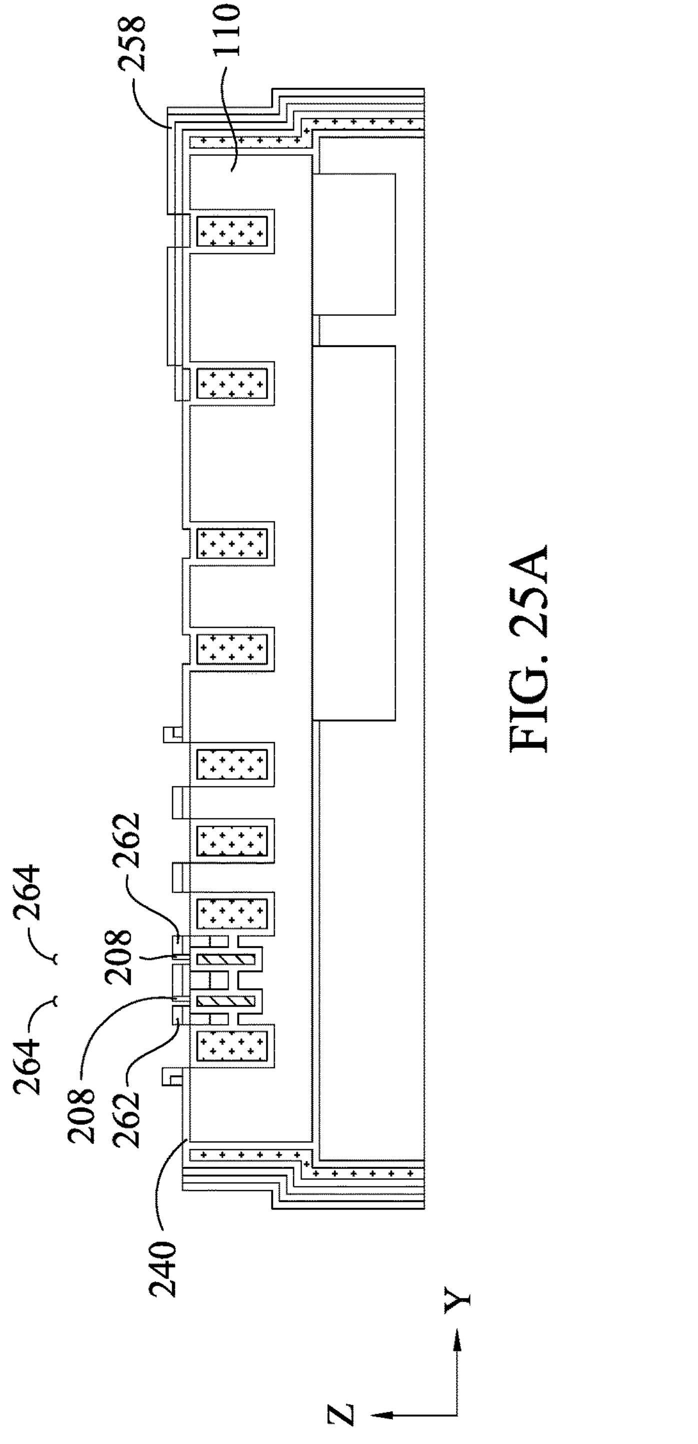
FIG. 25A is a side cross-sectional view of the package after etching of the third dielectric layer to form vertical dielectric layers above the first array of piezoelectric fingers.
Figure 25B:
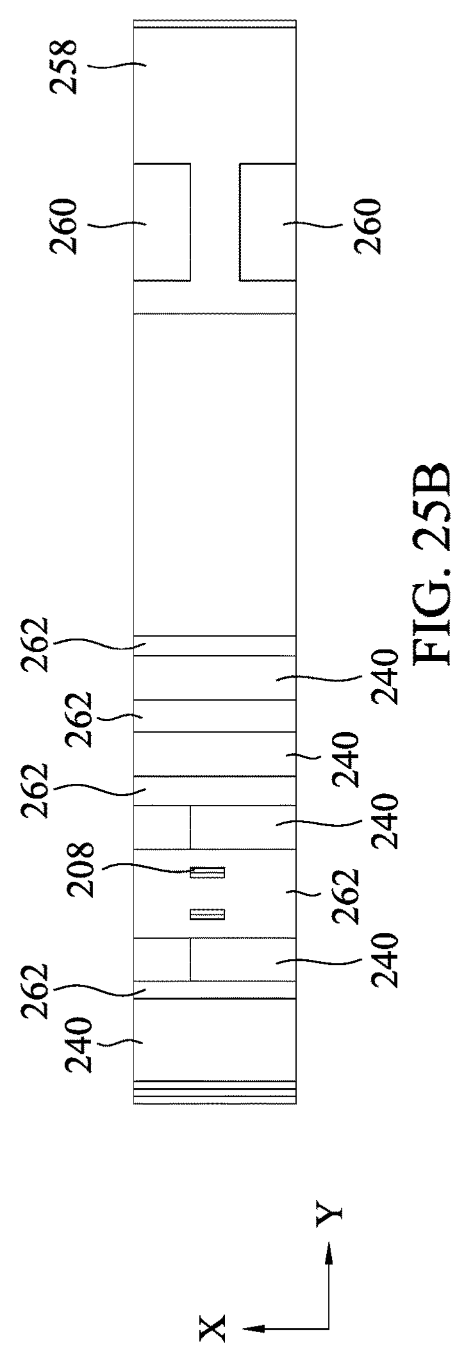
FIG. 25B is a plan view.

In step 342 of FIG. 4B and as illustrated in FIG. 24, a third dielectric layer 270 is deposited over the top wafer 110. The deposition may be performed using CVD, PVD, or other suitable methods. Then, in step 344 of FIG. 4B and as illustrated in FIG. 25A and FIG. 25B, the third dielectric layer is patterned to form a vertical dielectric layer 208 in each slot 264. The third dielectric layer is otherwise removed from the top surface of the top wafer.

Figure 26:
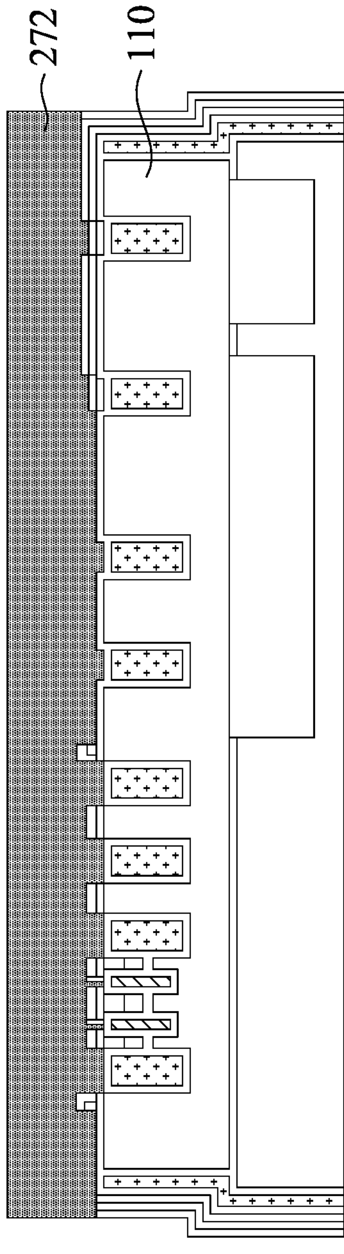
FIG. 26 is a side cross-sectional view of the package after deposition of metal.
Figure 27A:
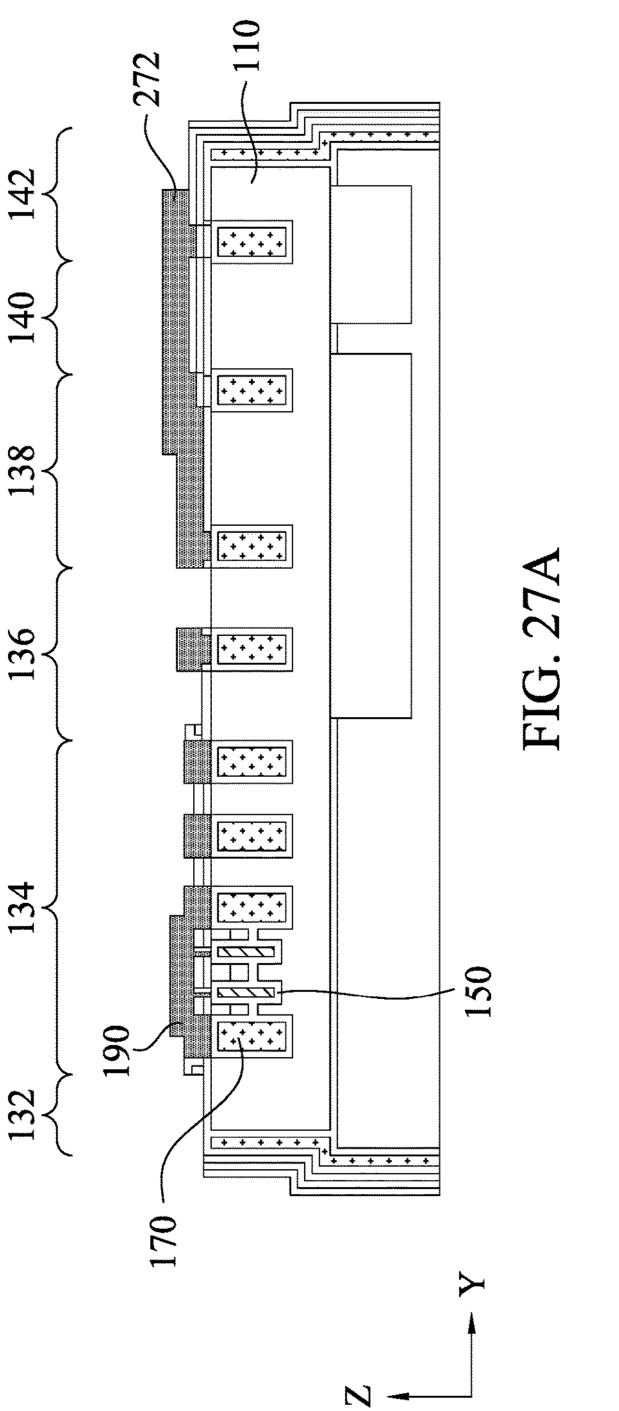
FIG. 27A is a side cross-sectional view of the package after etching to form a metal cap.
Figure 27B:
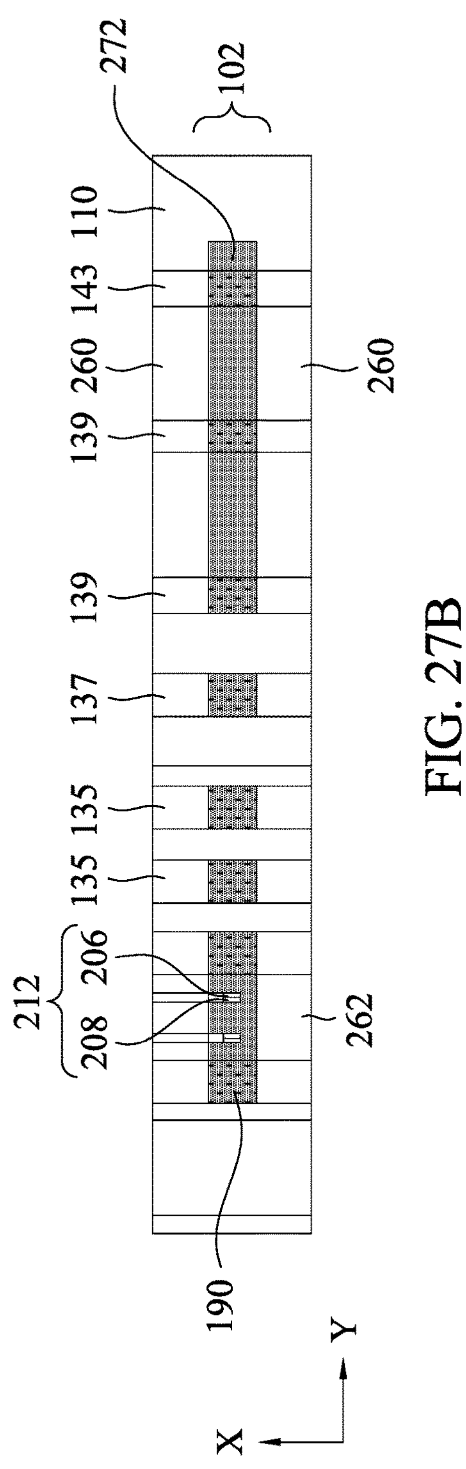
FIG. 27B is a plan view.

In step 346 of FIG. 4B and as illustrated in FIG. 26, a metal layer 272 is deposited over the top wafer 110. The deposition may be performed using CVD, PVD, or other suitable methods. Then, in step 348 of FIG. 4B and as illustrated in FIG. 27A and FIG. 27B, the metal layer is patterned to form a vertical metal layer 206 in each slot 264. This vertical metal layer is adjacent to, and directly contacts, the vertical oxide layer in the slot. The combination of the vertical metal layer 206 and the vertical oxide layer 208 is also referred to herein as a micro-spring precursor structure 212 or a vertical composite structure.

As best shown in FIG. 27B, the metal layer 272 is also patterned to form a metal cap 190 over the distal ends of the two arrays of fingers 150. 170. The metal layer is also patterned to remain in a central section 102 upon the other trenches 135, 137, 139, 143 in the driving comb section 134, the hinge section 136, the inner frame section 138, the spring section 140, and the outer frame section 142. It is noted that the metal layer 272 has two different heights; this can be obtained through two consecutive mask/etch steps. The location of the micro-spring precursor structures 212 is also indicated for reference.

Figures 28A, 28B:
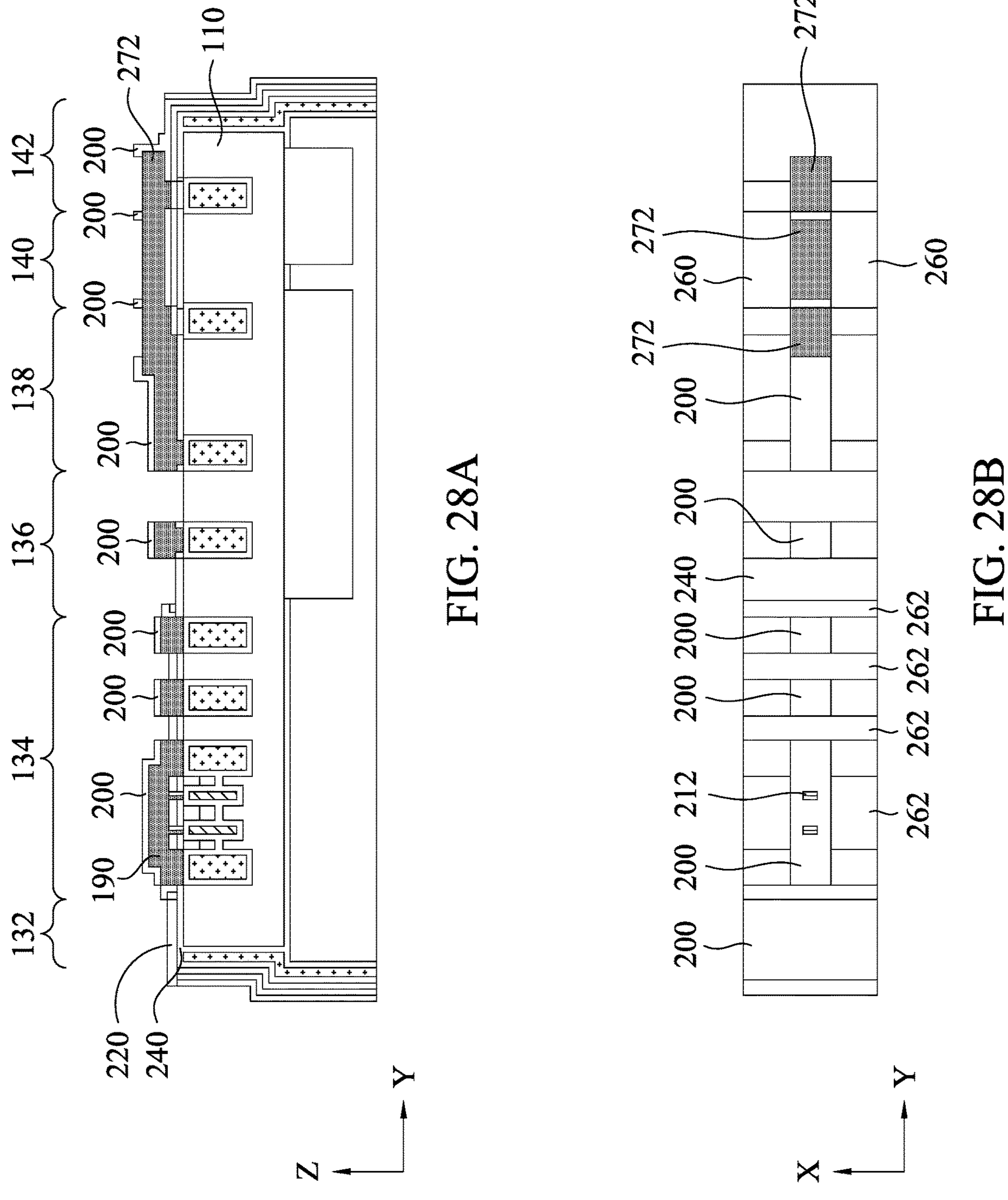
FIG. 28A is a side cross-sectional view of the package after formation of a passivation layer.
FIG. 28B is a plan view.

Next, in step 350 of FIG. 4C and as illustrated in FIG. 28A and FIG. 28B, a passivation layer 200 is formed upon the metal cap 190. The passivation layer 200 is also formed upon the metal layer 272 in the driving comb section 134, the hinge section 136, the inner frame section 138, the spring section 140, and the outer frame section 142. The passivation layer may be formed by deposition of a fourth dielectric layer and patterning to remove the fourth dielectric layer from undesired locations. Although not visible, the passivation layer is also present upon the sides of the metal cap 190 and the metal layer 272.

Figures 29A, 29B:
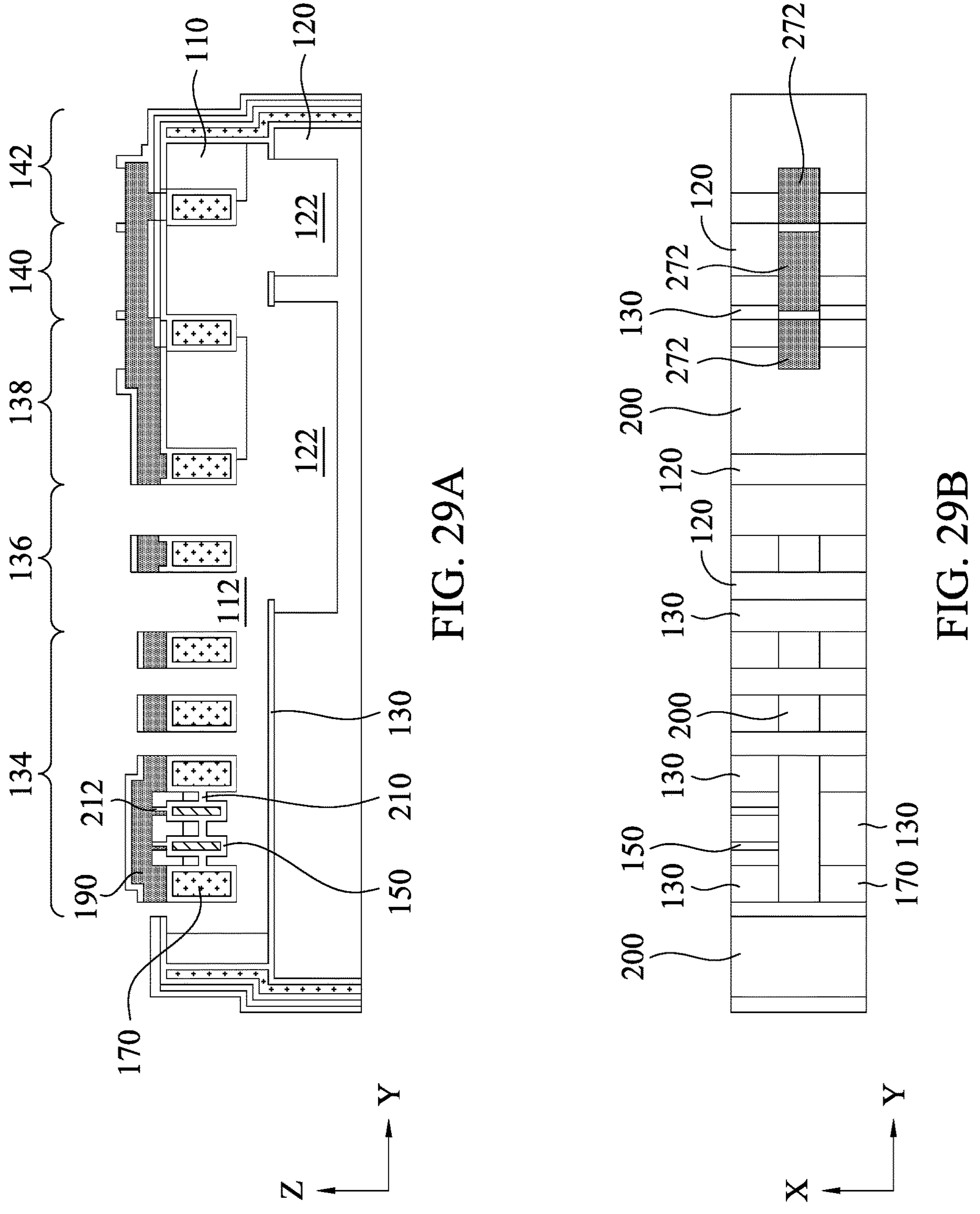
FIG. 29A is a side cross-sectional view of the package after silicon etching of the top wafer to form a cavity below the micromechanical arm array.
FIG. 29B is a plan view.

Then, in step 352 of FIG. 4C and as illustrated in FIG. 29A and FIG. 29B, a cavity 112 is formed in the top wafer 110 below the two arrays of fingers 150, 170. This may be done, for example, by patterning the top wafer, then etching through the exposed vertical spacers 262 and the first dielectric layer 240 (see FIG. 28A and FIG. 28B) below the vertical spacers using a dry etch process, then etching the silicon using a wet etch process. In this regard, the wet etch process can be controlled by timing. After the wet etchant etches through the top wafer, the cavities 122 in the bottom wafer provide a volume to collect and neutralize the wet etchant. The material of the top wafer is also etched in the hinge section 136 and the spring section 140. Some undercutting may occur, which is acceptable. As a result of this etching step, the micro-spring precursor structures 210, 212 are released from the top wafer and the two etch stop layers as well. When viewed from the top, the bonding layer 130 and portions of the bottom wafer 120 are also visible.

Next, in step 354 of FIG. 4C, annealing is performed. The annealing step may be performed in a heating chamber at an elevated temperature (e.g., from about 800° C. to about 1,600° C.). As a result, micro-springs 202, 204 are formed from the micro-spring precursor structures. The resulting micromechanical arm array 148 is shown in FIG. 1.

Figure 30A:
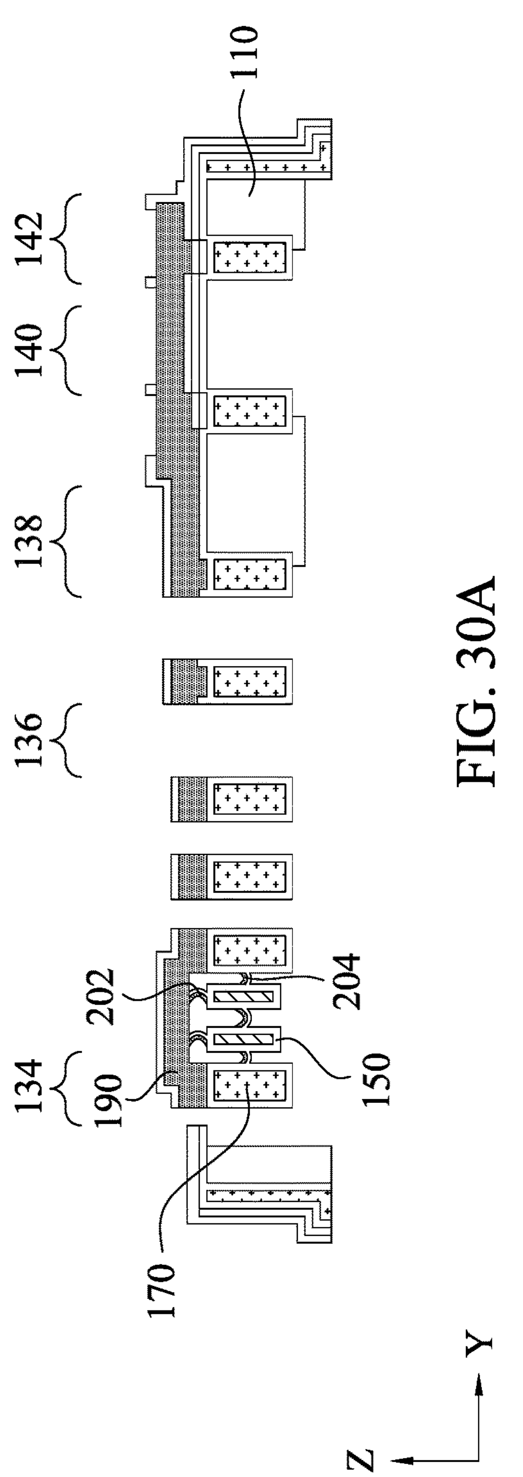
FIG. 30A is a side cross-sectional view of the package after annealing and the bottom wafer is removed, leaving the top wafer.
Figure 30B:
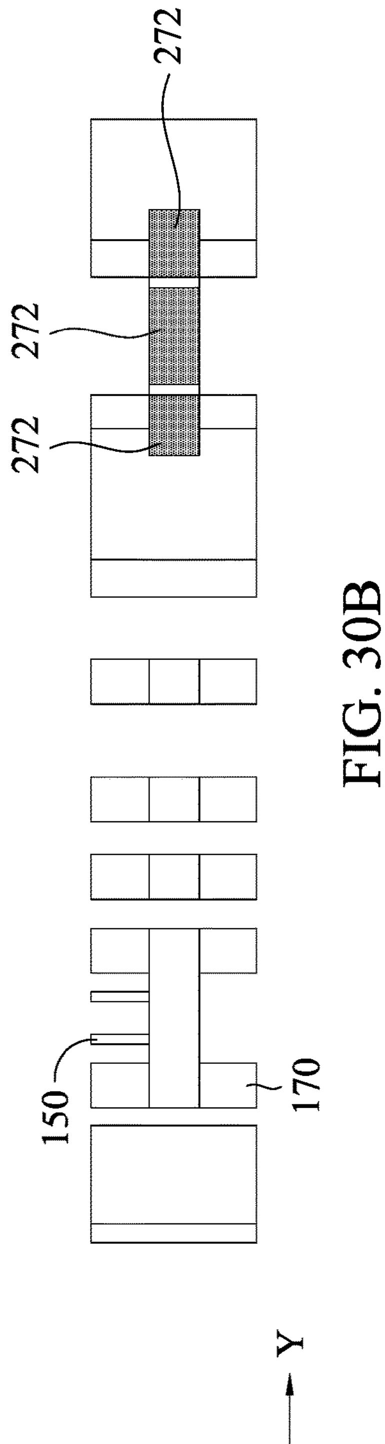
FIG. 30B is a plan view.

In some embodiments, the package as illustrated in FIG. 1 may be used as part of the MEMS actuator. In other embodiments, the bottom wafer 120 is subsequently removed or separated from the top wafer 110. This is indicated as optional step 356 of FIG. 4C, and the resulting structure is illustrated in FIG. 30A and FIG. 30B.

Any metal layer discussed herein may generally be formed from any conductive metal or conductive oxide. Examples of suitable metals may include copper, aluminum, nickel, chromium, gold, germanium, silver, titanium, tungsten, platinum, tantalum, ruthenium, cobalt, rhenium, palladium, or zirconium; composites like TiN, WN, or TaN; or alloys thereof like AlCu. Examples of suitable conductive oxides may include indium tin oxide (ITO), zinc oxide (ZnO), tin oxide (SnO), aluminum zinc oxide (AlZnO), indium oxide (InO), or cadmium oxide (CdO). The metal or oxide material may be deposited, for example, via evaporation or sputtering, plating, chemical vapor deposition (CVD), physical vapor deposition (PVD), atomic layer deposition (ALD), or other suitable methods.

The structures and methods of the present disclosure also refer to several different dielectric layers. Such dielectric layers can generally be made from any suitable dielectric material or combination thereof, although the characteristics of any particular layer may also be further defined. Examples of dielectric materials may include silicon dioxide ($SiO_2$), silicon nitride ($Si_3N_4$), silicon carbide (SiC), hafnium dioxide ($HfO_2$), zirconium dioxide ($ZrO_2$), aluminum oxide ($Al_2O_3$), silicon oxynitride ($SiO_xN_y$), hafnium oxynitride ($HfO_xN_y$) or zirconium oxynitride ($ZrO_xN_y$), or hafnium silicates ($HfSi_xO_y$) or zirconium silicates ($ZrSi_xO_y$) or silicon carboxynitride ($SiC_xO_yN_z$), or hexagonal boron nitride (hBN). Other dielectric materials may include tantalum oxide ($Ta_2O_5$), nitrides such as silicon nitride, polysilicon, phosphosilicate glass (PSG), fluorosilicate glass (FSG), undoped silicate glass (USG), high-stress undoped silicate glass (HSUSG), and borosilicate glass (BSG). The dielectric layer may be formed by any suitable means, including chemical vapor deposition (CVD), physical vapor deposition (PVD), atomic layer deposition (ALD), thermal oxidation, or other suitable methods.

It is also noted that certain conventional steps are not expressly described in the discussion above. For example, a pattern/structure may be formed in a given layer by applying a photoresist layer, patterning the photoresist layer, developing the photoresist layer, and then etching to transfer the pattern to the given layer.

Generally, a photoresist layer may be applied, for example, by spin coating, or by spraying, roller coating, dip coating, or extrusion coating. Typically, in spin coating, the substrate is placed on a rotating platen, which may include a vacuum chuck that holds the substrate in plate. The photoresist composition is then applied to the center of the substrate. The speed of the rotating platen is then increased to spread the photoresist evenly from the center of the substrate to the perimeter of the substrate. The rotating speed of the platen is then fixed, which can control the thickness of the final photoresist layer.

Next, the photoresist composition is baked or cured to remove the solvent and harden the photoresist layer. In some particular embodiments, the baking occurs at a temperature of about 90° C. to about 110° C. The baking can be performed using a hot plate or oven, or similar equipment. As a result, the photoresist layer is formed on the substrate.

The photoresist layer is then patterned via exposure to radiation. The radiation may be any light wavelength which carries a desired mask pattern. In particular embodiments, EUV light having a wavelength of about 13.5 nm is used for patterning, as this permits smaller feature sizes to be obtained. This results in some portions of the photoresist layer being exposed to radiation, and some portions of the photoresist not being exposed to radiation. This exposure causes some portions of the photoresist to become soluble in the developer and other portions of the photoresist to remain insoluble in the developer.

An additional photoresist bake step (post exposure bake, or PEB) may occur after the exposure to radiation. For example, this may help in releasing acid leaving groups (ALGs) or other molecules that are significant in chemical amplification photoresist.

The photoresist layer is then developed using a developer. The developer may be an aqueous solution or an organic solution. The soluble portions of the photoresist layer are dissolved and washed away during the development step, leaving behind a photoresist pattern. One example of a common developer is aqueous tetramethylammonium hydroxide (TMAH). Generally, any suitable developer may be used. Sometimes, a post develop bake or "hard bake" may be performed to stabilize the photoresist pattern after development, for optimum performance in subsequent steps.

Continuing, portions of the given layer below the patterned photoresist layer are now exposed. Etching transfers the photoresist pattern to the given layer below the patterned photoresist layer. After use, the patterned photoresist layer can be removed, for example, using various solvents such as N-methyl-pyrrolidone (NMP) or alkaline media or other strippers at elevated temperatures, or by dry etching using oxygen plasma.

Generally, any etching step described herein may be performed using wet etching, dry etching, or plasma etching processes such as reactive ion etching (RIE) or inductively coupled plasma (ICP), or combinations thereof, as appropriate. The etching may be anisotropic. Depending on the material, etchants may include carbon tetrafluoride ($CF_4$), hexafluoroethane ($C_2F_6$), octafluoropropane ($C_3F_8$), fluoroform ($CHF_3$), difluoromethane ($CH_2F_2$), fluoromethane ($CH_3F$), carbon fluorides, nitrogen ($N_2$), hydrogen ($H_2$), oxygen ($O_2$), argon (Ar), xenon (Xe), xenon difluoride ($XeF_2$), helium (He), carbon monoxide (CO), carbon dioxide ($CO_2$), fluorine ($F_2$), chlorine ($Cl_2$), hydrogen bromide (HBr), hydrofluoric acid (HF), nitrogen trifluoride ($NF_3$), sulfur hexafluoride ($SF_6$), boron trichloride ($BCl_3$), ammonia ($NH_3$), bromine ($Br_2$), or the like, or combinations thereof in various ratios. For example, silicon dioxide can be wet etched using hydrofluoric acid and ammonium fluoride. Alternatively, silicon dioxide can be dry etched using various mixtures of $CHF_3$, $O_2$, $CF_4$, and/or $H_2$.

Figure 31A:
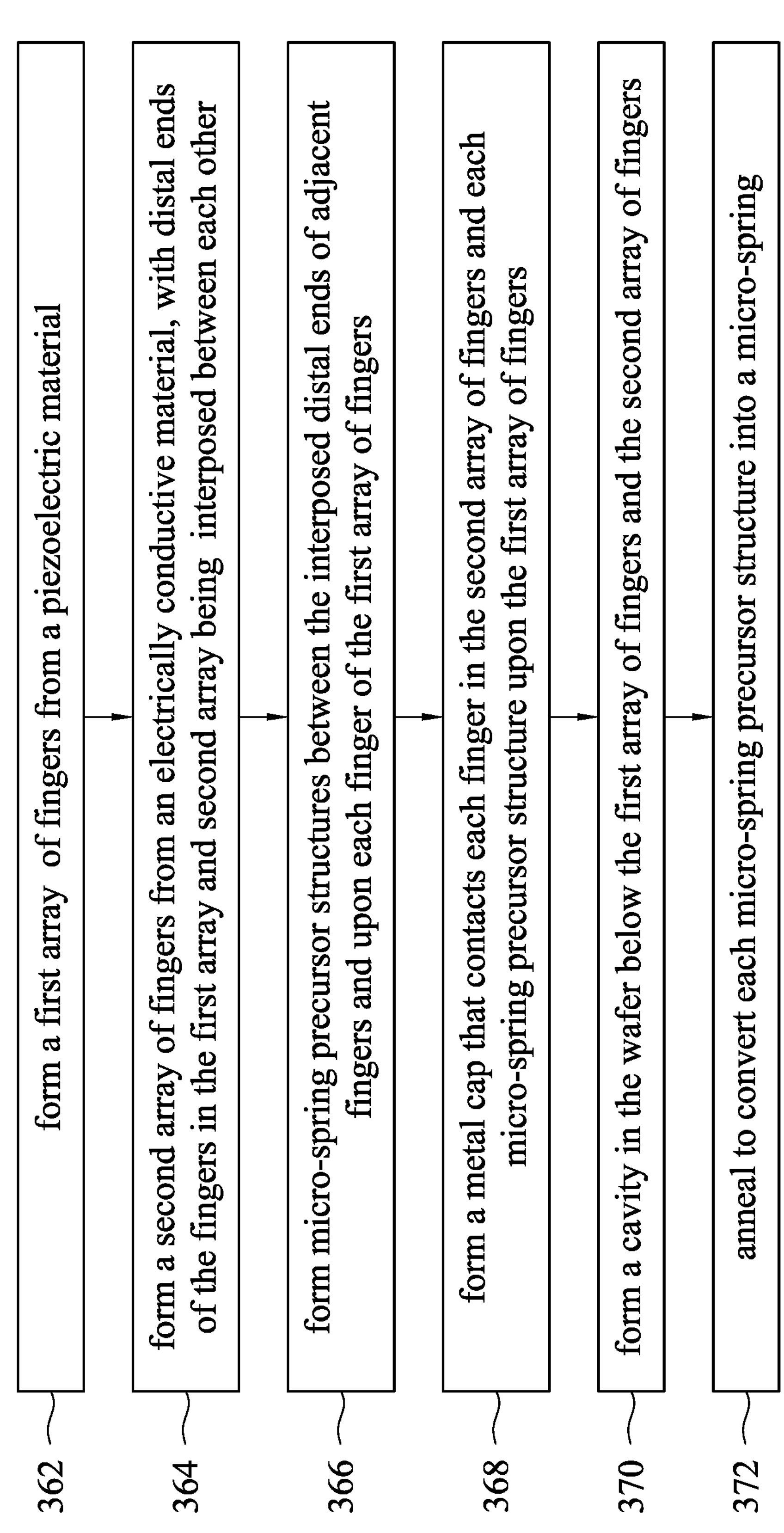
FIG. 31A is a flow chart illustrating a second method for making a micromechanical arm array for a MEMS actuator, in accordance with some embodiments.

Continuing, FIG. 31A is a flow chart illustrating a more general method 360 for making a micromechanical arm array for a MEMS actuator, in accordance with some embodiments. In step 362 of FIG. 31A, a first array of fingers 150 is formed from a piezoelectric material on a wafer 110. This structure is illustrated in FIG. 13A and FIG. 13B.

In step 364 of FIG. 31A, a second array of fingers 170 is formed from an electrically conductive material on the wafer 110. The distal ends 160 of the first array of fingers and the distal ends 180 of the second array of fingers are interposed between each other. This structure is illustrated in FIG. 15A and FIG. 15B.

In step 366 of FIG. 31A, micro-spring precursor structures 210, 212 are formed between the interposed distal ends 160, 180 of adjacent fingers and upon each finger of the first array of fingers (at their distal end 160). The micro-spring precursor structures 210 can also be described as being formed on pillars 222 located at the ends of two sets of trenches 230, 232. This structure is illustrated in FIG. 9A and FIG. 9B.

In step 368 of FIG. 31A, a metal cap 190 is formed that contacts each finger 170 in the second array of fingers and each micro-spring precursor structure 212 upon the first array of fingers. This structure is illustrated in FIG. 27A and FIG. 27B.

In step 370 of FIG. 31A, the wafer 110 is etched to form a cavity 112 below the first array of fingers and the second array of fingers. This structure is illustrated in FIG. 29A and FIG. 29B. It is noted that the micro-spring precursor structures 210, 212 are now exposed.

In step 372 of FIG. 31A, annealing is performed to convert each micro-spring precursor structure into a micro-spring 202, 204. The resulting structure is illustrated in FIG. 1.

Figure 31B:
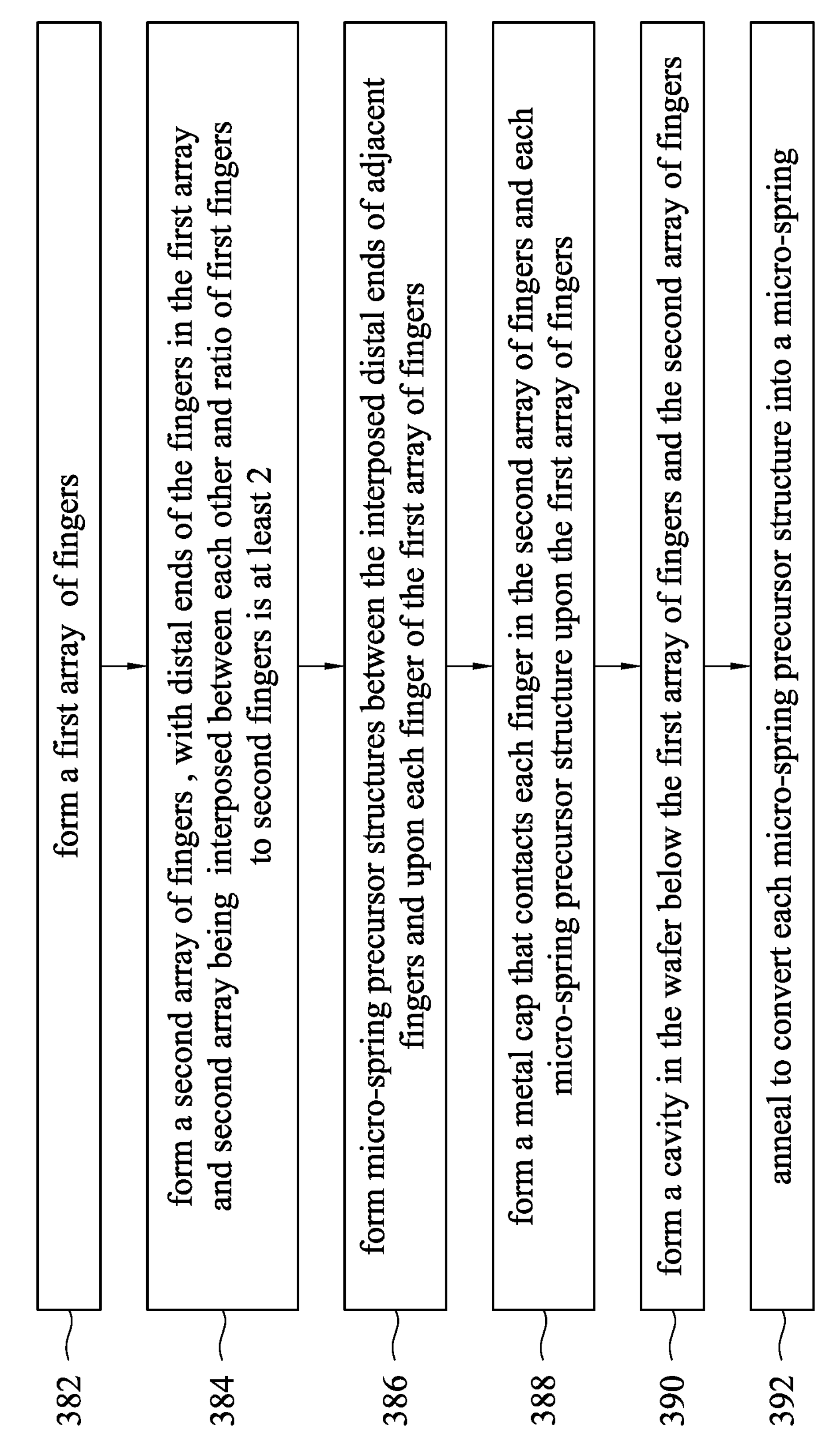
FIG. 31B is a flow chart illustrating a third method for making a micromechanical arm array for a MEMS actuator, in accordance with some embodiments.

Continuing, FIG. 31B is a flow chart illustrating another general method 380 for making a micromechanical arm array for a MEMS actuator, in accordance with some embodiments. This method is substantially similar to that of FIG. 31A. However, in this method, the ratio of the number of fingers in the first array of fingers to the number of fingers in the second array of fingers is at least 2:1, and may range up to 10:1. Put another way, if the number of first fingers is divided by the number of second fingers, the quotient is an integer that is at least 2. Thus, the first array of fingers 150 and the second array of fingers 170 can both be made of a piezoelectric material, or both be made of a non-piezoelectric electrically conductive material.

In step 382 of FIG. 31B, a first array of fingers 150 is formed on a wafer 110. In step 384, a second array of fingers 170 is formed on the wafer 110. The distal ends 160 of the first array of fingers and the distal ends 180 of the second array of fingers are interposed between each other. This structure is illustrated in FIG. 15A and FIG. 15B. In specific embodiments, as mentioned above, the ratio of the number of first fingers 150 to the number of second fingers 170 is an integer that is at least 2.

In step 386 of FIG. 31B, micro-spring precursor structures 210, 212 are formed between the interposed distal ends 160, 180 of adjacent fingers and upon each finger of the first array of fingers (at their distal end 160). In step 388, a metal cap 190 is formed that contacts each finger 170 in the second array of fingers and each micro-spring precursor structure 212 upon the first array of fingers. In step 390, the wafer 110 is etched to form a cavity 112 below the first array of fingers and the second array of fingers. In step 392, annealing is performed to convert each micro-spring precursor structure into a micro-spring 202, 204. The resulting structure is illustrated in FIG. 1.

Figure 32:
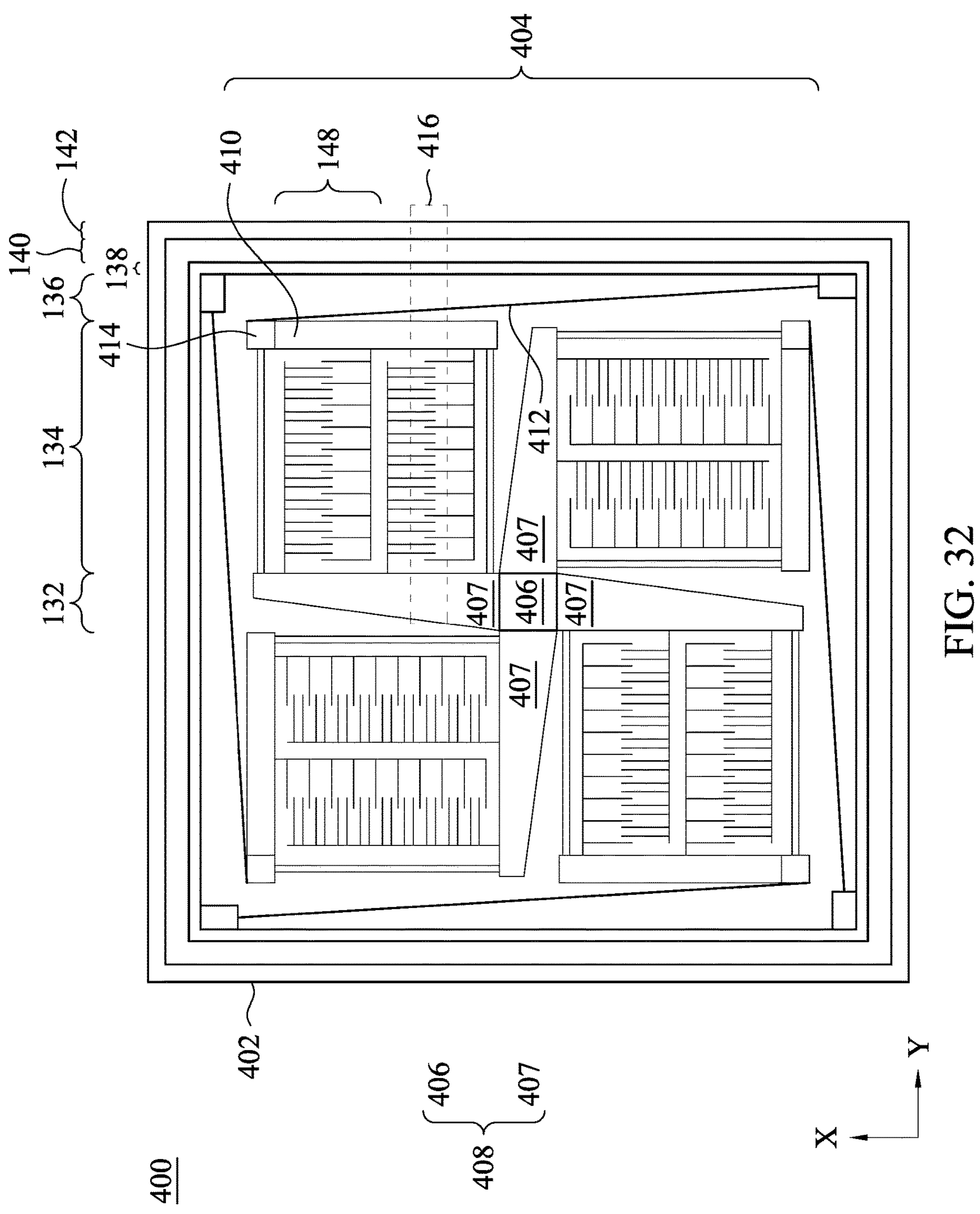
FIG. 32 is a plan view of a MEMS actuator, in accordance with some embodiments.

Continuing, FIG. 32 is a plan view of a MEMS actuator 400, in accordance with some embodiments. The illustrated actuator includes a four-sided frame 402 which surrounds and is spaced apart from a sensor connection component 404. The sensor connection component 404 includes an anchor 406 located at the center. As illustrated here, four anchor arms 407 extend from the anchor, and together they can be considered an anchor structure 408.

The sensor connection component can be described as having four quadrants, each quadrant being located between two anchor arms. Within each quadrant, an anchor arm supports 407 one or more micromechanical arm arrays 148 within a driving comb section 134 as previously described. As illustrated here, the driving comb section includes two micromechanical arm arrays, but any number of such arrays may be present. In particular embodiments, the driving comb section may contain from one to ten micromechanical arm arrays. The length of the driving comb section opposite the anchor arm 407 can serve as a support 410. A hinge 412 or cantilever traverses an open space to join the support 410 to a non-adjacent corner of the frame 402. Also located on each support is a sensor mount 414.

Box 416 generally indicates the location of the views of FIGS. 5-30B with respect to the entire actuator, and the process steps described above can be applied to the remainder of the MEMS actuator. The anchor arm section 132, driving comb section 134, hinge section 136, inner frame section 138, spring section 140, and outer frame section 142 of FIG. 1 are also indicated here. The anchor arm section 132 is part of the anchor arm 407. The inner frame section 138, spring section 140, and outer frame section 142 make up part of the frame 402 of the actuator. The overall dimensions of the MEMS actuator are usually in the millimeter range, for example below 20 mm×20 mm.

The MEMS actuator is useful for optical image stabilization (OIS). OIS is used to reduce blurring that can occur due to motion of an imaging device during exposure, such as binoculars, cameras (handheld, still, or video), telescopes, and cellphones/smartphones. The motion causes light which is initially detected in one pixel to move to an adjacent pixel, which shows up in the captured image as blurring. Blurring becomes more evident at higher resolution as the pixel size decreases. In the present disclosure, OIS is performed by moving the image sensor to compensate for changes in the optical path. This may be preferable to moving the lens because it reduces the weight and complexity of the lens(es), and the compensation can also be much quicker (on the order of a few milliseconds, rather than tens of milliseconds). The MEMS actuator can move in all five axes (i.e., X, Y, Roll, Yaw, and Pitch).

Figure 33:
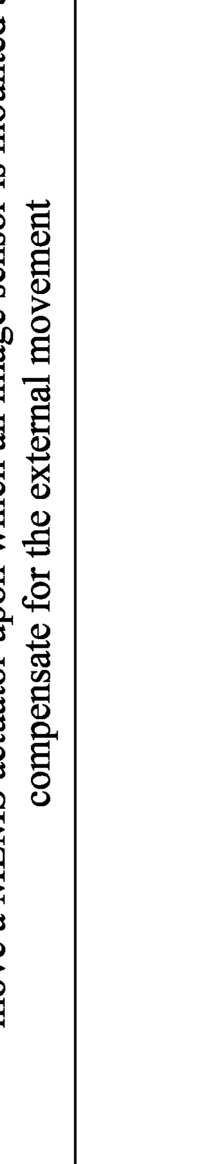
FIG. 33 is a flow chart illustrating a method for stabilizing an optical image against external movement, in accordance with some embodiments.

FIG. 33 is a flow chart illustrating a method 440 for stabilizing an optical image against external movement, in accordance with some embodiments. This method is performed using a MEMS actuator as in FIG. 32. Some steps of the method are also illustrated in FIG. 34A and FIG. 34B.

Figure 34A:
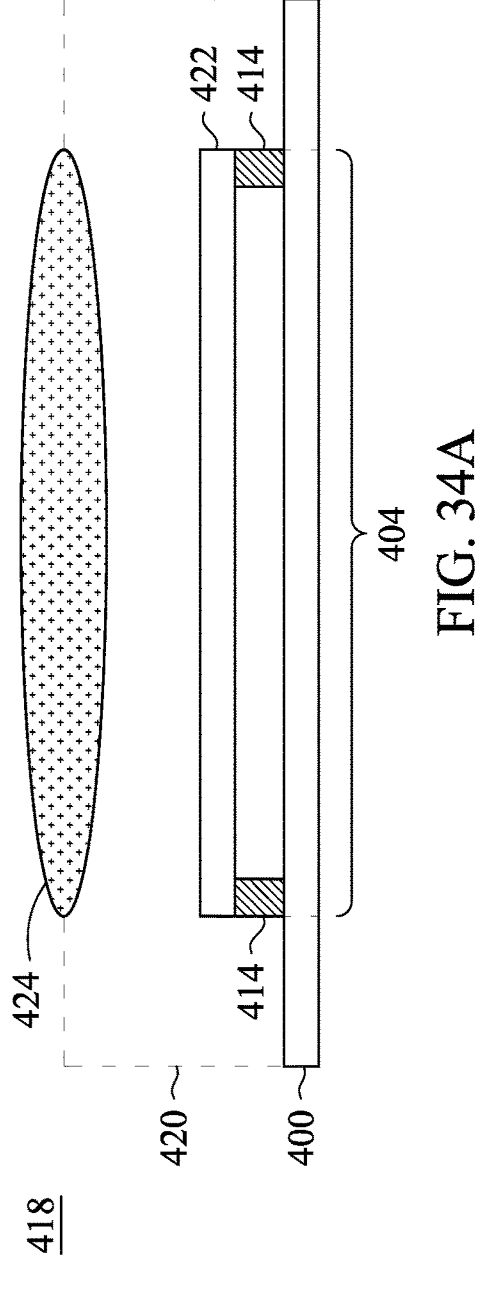
FIG. 34A is a side cross-sectional view of an optical image capture device in a first position.
Figure 34B:
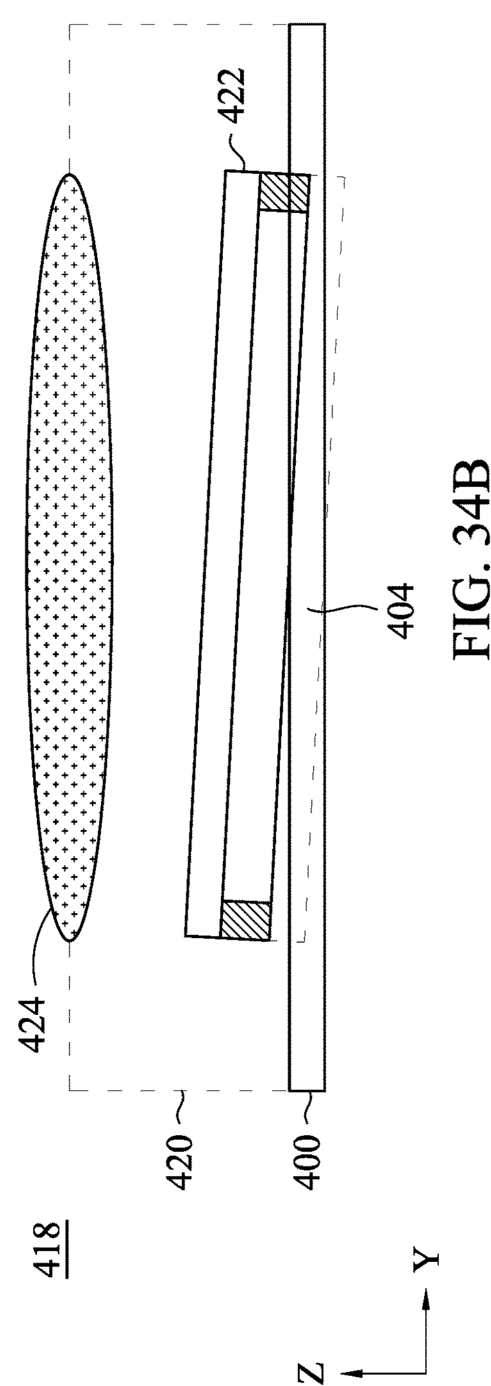
FIG. 34B is a side cross-sectional view of the device in a second position.

Initially, FIG. 34A is a side cross-sectional view of an optical image capture device 418. The device includes a MEMS actuator 400 as previously described, located within a housing 420. The sensor connection component 404 is labeled. Two sensor mounts 414 are also illustrated, and an image sensor 422 is mounted upon the MEMS actuator by attachment to the sensor mounts 414. The image sensor may be, for example, a charge-coupled device (CCD) or an active-pixel sensor (CMOS sensor). One or more lenses 424 is present within the housing. The image sensor is located between the lens and the MEMS actuator, so that light falls on the image sensor. Here, the image sensor 422 is in a first position, and an optical light path is present between the lens 424 and the image sensor 422.

When the device/housing is subjected to external movement, for example due to shaking in the hands of the user, in step 442 of FIG. 33, the MEMS actuator is moved to compensate for the external movement. This can be done, for example, by sending an electrical signal to the micromechanical arm array in one or more quadrants to change the physical distance between interlaced fingers. As illustrated in FIG. 34B, this causes the sensor connection component 404 of the actuator 400 to tilt relative to the frame, which moves the image sensor 422 to a second position, so that the optical light path still hits the same location on the image sensor.

The MEMS structures including a micromechanical arm array with piezoelectric fingers is more stable and more difficult to break. The same result occurs when the ratio of fingers between the two arrays of fingers in the micromechanical arm array is an integer greater than 1. This improves device lifetime, and increases customer satisfaction.

Some embodiments of the present disclosure thus relate to various methods for making a micromechanical arm array for a MEMS actuator. A first array of fingers is formed from a piezoelectric material on a wafer. A second array of fingers is formed from an electrically conductive material on the wafer. The distal ends of the first array of fingers and the distal ends of the second array of fingers are interposed between each other. Micro-spring precursor structures are formed between the interposed distal ends of adjacent fingers and upon each finger of the first array of fingers. A metal cap is formed that contacts each finger in the second array of fingers and each micro-spring precursor structure upon the first array of fingers. A cavity is then formed in the wafer below the first array of fingers and the second array of fingers. Annealing is performed to convert each micro-spring precursor structure into a micro-spring.

Other embodiments disclosed herein relate to various methods for making a micromechanical arm array for a MEMS actuator. A package is received that comprises a top wafer bonded to a bottom wafer. The top wafer is patterned to form a recess that includes a plurality of pillars spaced apart from each other within the recess. A dielectric layer is formed on exposed surfaces of the recess in the top wafer. A metal layer is formed upon each pillar in the recess to obtain a horizontal composite structure upon each pillar. A sacrificial spacer is formed upon each horizontal composite structure. A dielectric layer is formed on exposed surfaces of the horizontal composite structures and the sacrificial spacers, resulting in a first set of trenches and a second set of trenches within the recess, and in a first dielectric layer upon the top wafer. A piezoelectric material is deposited into the first set of trenches to form a first array of fingers. An electrically conductive material is deposited into the second set of trenches to form a second array of fingers. The distal ends of the first array of fingers and the distal ends of the second array of fingers are interposed between each other. A vertical composite structure is formed upon each finger of the first array of fingers. Each vertical composite structure comprises a dielectric layer bonded to a metal layer. A metal cap is formed that contacts each finger in the second array of fingers and each vertical composite structure upon the first array of fingers. Etching is performed to remove the sacrificial spacers and form a cavity within the top wafer. Annealing is then performed to convert each horizontal composite structure and each vertical composite structure into a micro-spring.

Also described in various embodiments herein are MEMS actuators that comprise an anchor structure. A plurality of micromechanical arm arrays are connected to the anchor structure. Each arm array comprises a first array of fingers and a second array of fingers. The first array of spaced-apart fingers is formed from a piezoelectric material and extends from a first arm in a first horizontal direction. The second array of spaced-apart fingers is formed from an electrically conductive material and extends from a second arm in the first horizontal direction. The distal ends of the first array of fingers and the distal ends of the second array of fingers are interposed between each other.

In further embodiments of the MEMS actuator each arm array further comprises: micro-springs connecting the interposed distal ends of each set of adjacent fingers; a metal cap above the distal ends of the first array of fingers and the distal ends of the second array of fingers; and micro-springs connecting the metal cap to the distal end of each finger of the first array of fingers.

Furthermore, the first array of fingers and the second array of fingers are located within a driving comb section. The arm array may further comprise an anchor arm section that connects to the anchor structure, a hinge section, an inner frame section, a spring section, and an outer frame section.

Also described in various embodiments herein are methods for stabilizing an optical image against external movement. This is done by moving a MEMS actuator upon which an image sensor is mounted to compensate for the external movement. The MEMS actuator comprises a plurality of micromechanical arm arrays connected to an anchor structure, with each arm array having components as described above.

The present disclosure also relates in various embodiments to optical image capture devices that comprise: an image sensor mounted to a MEMS actuator; and a lens located so that the image sensor is between the lens and the MEMS actuator. The MEMS actuator comprises a plurality of micromechanical arm arrays connected to an anchor structure. Each arm array comprises: a first array of spaced-apart fingers formed from a piezoelectric material and extending from a first arm in a first horizontal direction; and a second array of spaced-apart fingers formed from an electrically conductive material and extending from a second arm in the first horizontal direction. The distal ends of the first array of fingers and the distal ends of the second array of fingers are interposed between each other.

Some further embodiments of the present disclosure also relate to various methods for making a micromechanical arm array for a MEMS actuator. A first array of fingers is formed on a wafer. A second array of fingers is formed on the wafer. The distal ends of the first array of fingers and the distal ends of the second array of fingers are interposed between each other. The ratio of the number of fingers in the first array to the number of fingers in the second array is an integer greater than 1. Micro-spring precursor structures are formed between the interposed distal ends of adjacent fingers and upon each finger of the first array of fingers. A metal cap is formed that contacts each finger in the second array of fingers and each micro-spring precursor structure upon the first array of fingers. A cavity is then formed in the wafer below the first array of fingers and the second array of fingers. Annealing is performed to convert each micro-spring precursor structure into a micro-spring.

Other embodiments disclosed herein relate to various methods for making a micromechanical arm array for a MEMS actuator. A package is received that comprises a top wafer bonded to a bottom wafer. The top wafer is patterned to form a recess that includes a plurality of pillars spaced apart from each other within the recess. A dielectric layer is formed on exposed surfaces of the recess in the top wafer. A metal layer is formed upon each pillar in the recess to obtain a horizontal composite structure upon each pillar. A sacrificial spacer is formed upon each horizontal composite structure. A dielectric layer is formed on exposed surfaces of the horizontal composite structures and the sacrificial spacers, resulting in a first set of trenches and a second set of trenches within the recess, and in a first dielectric layer upon the top wafer. A first array of fingers is formed in the first set of trenches. A second array of fingers is formed in the second set of trenches. The distal ends of the first array of fingers and the distal ends of the second array of fingers are interposed between each other. The ratio of the number of fingers in the first array to the number of fingers in the second array is an integer greater than 1. A vertical composite structure is formed upon each finger of the first array of fingers. Each vertical composite structure comprises a dielectric layer bonded to a metal layer. A metal cap is formed that contacts each finger in the second array of fingers and each vertical composite structure upon the first array of fingers. Etching is performed to remove the sacrificial spacers and form a cavity within the top wafer. Annealing is then performed to convert each horizontal composite structure and each vertical composite structure into a micro-spring.

Also described in various embodiments herein are MEMS actuators that comprise an anchor structure. A plurality of micromechanical arm arrays are connected to the anchor structure. Each arm array comprises a first array of fingers and a second array of fingers. The first array of spaced-apart fingers extends from a first arm in a first horizontal direction. The second array of spaced-apart fingers extends from a second arm in the first horizontal direction. The distal ends of the first array of fingers and the distal ends of the second array of fingers are interposed between each other. The ratio of the number of fingers in the first array to the number of fingers in the second array is an integer greater than 1.

In further embodiments of the MEMS actuator each arm array further comprises: micro-springs connecting the interposed distal ends of each set of adjacent fingers; a metal cap above the distal ends of the first array of fingers and the distal ends of the second array of fingers; and micro-springs connecting the metal cap to the distal end of each finger of the first array of fingers.

Furthermore, the first array of fingers and the second array of fingers are located within a driving comb section. The arm array may further comprise an anchor arm section that connects to the anchor structure, a hinge section, an inner frame section, a spring section, and an outer frame section.

Also described in various embodiments herein are methods for stabilizing an optical image against external movement. This is done by moving a MEMS actuator upon which an image sensor is mounted to compensate for the external movement. The MEMS actuator comprises a plurality of micromechanical arm arrays connected to an anchor structure. Each arm array has two arrays of fingers. The ratio of the number of fingers in the first array to the number of fingers in the second array is an integer greater than 1.

Finally, the present disclosure also relates in various embodiments to optical image capture devices that comprise: an image sensor mounted to a MEMS actuator; and a lens located so that the image sensor is between the lens and the MEMS actuator. The MEMS actuator comprises a plurality of micromechanical arm arrays connected to an anchor structure. Each arm array comprises: a first array of spaced-apart fingers extending from a first arm in a first horizontal direction; and a second array of spaced-apart fingers extending from a second arm in the first horizontal direction. The distal ends of the first array of fingers and the distal ends of the second array of fingers are interposed between each other. The ratio of the number of fingers in the first array to the number of fingers in the second array is an integer greater than 1.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for making a micromechanical arm array for a MEMS actuator, comprising:

forming a first array of fingers from a piezoelectric material on a wafer;

forming a second array of fingers from an electrically conductive material on the wafer, wherein distal ends of the first array of fingers and distal ends of the second array of fingers are interposed between each other;

forming micro-spring precursor structures between the interposed distal ends of adjacent fingers and upon each finger of the first array of fingers;

forming a metal cap that contacts each finger in the second array of fingers and each micro-spring precursor structure upon the first array of fingers;

forming a cavity in the wafer below the first array of fingers and the second array of fingers; and annealing to convert each micro-spring precursor structure into a micro-spring.

2. The method of claim 1, wherein the piezoelectric material is barium titanate, lead titanate, lead zirconate titanate (PZT), or potassium sodium niobate (KNN).

3. The method of claim 1, wherein the electrically conductive material is polysilicon.

4. The method of claim 1, wherein the metal cap comprises aluminum or an aluminum alloy.

5. The method of claim 1, wherein a ratio of the number of fingers in the first array of fingers to the number of fingers in the second array of fingers is 1:1 or higher.

6. The method of claim 1, wherein a height of the fingers in the second array of fingers is greater than a height of the fingers in the first array of fingers.

7. The method of claim 1, wherein a width of the fingers in the second array of fingers is greater than a width of the fingers in the first array of fingers.

8. The method of claim 1, wherein each finger in the first array of fingers and the second array of fingers is covered with a cover layer.

9. The method of claim 1, wherein each micro-spring precursor structure comprises a metal layer and a dielectric layer bonded to each other.

10. The method of claim 1, wherein each micro-spring precursor structure between the interposed distal ends of adjacent fingers is formed by:

patterning the wafer to form a recess that includes a plurality of pillars spaced apart from each other within the recess;

forming a dielectric layer on each pillar; and forming a metal layer upon each pillar to obtain the micro-spring precursor structure.

11. The method of claim 1, wherein each micro-spring precursor structure upon a finger of the first array of fingers is formed by:

depositing a first etch stop layer over the wafer;

depositing a second etch stop layer over the wafer;

patterning the first etch stop layer and the second etch stop layer to create slots over the distal ends of the first array of fingers;

forming a vertical dielectric layer in each slot; and depositing a metal layer that forms a vertical metal layer in each slot to obtain the micro-spring precursor structure.

12. A method for making a micromechanical arm array for a MEMS actuator, comprising:

receiving a package that comprises a top wafer bonded to a bottom wafer;

patterning the top wafer to form a recess that includes a plurality of pillars spaced apart from each other within the recess;

forming a dielectric layer on exposed surfaces of the recess in the top wafer;

forming a metal layer upon each pillar in the recess to obtain a horizontal composite structure upon each pillar;

forming a sacrificial spacer upon each horizontal composite structure;

forming a dielectric layer on exposed surfaces of the horizontal composite structures and the sacrificial spacers, resulting in a first set of trenches and a second set of trenches within the recess, and in a first dielectric layer upon the top wafer;

depositing a piezoelectric material into the first set of trenches to form a first array of fingers;

depositing an electrically conductive material into the second set of trenches to form a second array of fingers, wherein distal ends of the first array of fingers and distal ends of the second array of fingers are interposed between each other;

forming a vertical composite structure upon each finger of the first array of fingers, each vertical composite structure comprising a dielectric layer bonded to a metal layer;

forming a metal cap that contacts each finger in the second array of fingers and each vertical composite structure upon the first array of fingers;

etching to remove the sacrificial spacers and form a cavity within the top wafer; and annealing to convert each horizontal composite structure and each vertical composite structure into a micro-spring.

13. The method of claim 12, wherein the plurality of pillars is formed on a stand above a base of the recess.

14. The method of claim 12, wherein proximal ends of the first array of fingers extend in a first direction and are joined to a first arm, and proximal ends of the second array of fingers extend in a second direction opposite the first direction and are joined to a second arm.

15. The method of claim 12, further comprising, after depositing the electrically conductive material into the second set of trenches to form the second array of fingers and prior to forming the vertical composite structure upon each finger of the first array of fingers:

extending the first dielectric layer over top surfaces of the first array of fingers and the second array of fingers;

exposing the top wafer in a driving comb section by removing portions of the first dielectric layer thereon;

depositing a first etch stop layer over the wafer substrate;

forming a second dielectric layer over the first etch stop layer;

patterning the second dielectric layer to expose the driving comb section, a hinge section, and a portion of an inner frame section of the top wafer;

depositing a second etch stop layer over the top wafer; and patterning the first etch stop layer and the second etch stop layer in the driving comb section to form vertical spacers and to create slots over the distal ends of the first array of fingers.

16. The method of claim 15, wherein the first etch stop layer and the second etch stop layer are made of the same material.

17. The method of claim 12, further comprising forming a passivation layer over the metal cap.

18. A MEMS actuator, comprising:

an anchor structure; and a plurality of micromechanical arm arrays connected to the anchor structure, each arm array comprising:

a first array of spaced-apart fingers formed from a piezoelectric material and extending from a first arm in a first horizontal direction; and a second array of spaced-apart fingers formed from an electrically conductive material and extending from a second arm in a second horizontal direction opposite the first horizontal direction, wherein distal ends of the first array of fingers and distal ends of the second array of fingers are interposed between each other; and micro-springs connecting the interposed distal ends of each set of adjacent fingers.

19. The MEMS actuator of claim 18, wherein each arm array further comprises:

a metal cap above the distal ends of the first array of fingers and the distal ends of the second array of fingers; and micro-springs connecting the metal cap to the distal end of each finger of the first array of fingers.

20. The MEMS actuator of claim 18, wherein the first array of fingers and the second array of fingers are located within a driving comb section, and the arm array further comprises an anchor arm section connected to the anchor structure, a hinge section, an inner frame section, a spring section, and an outer frame section.

* * * * *